(12) United States Patent
Kume

(10) Patent No.: US 8,441,563 B2
(45) Date of Patent: May 14, 2013

(54) PHOTOELECTRIC CONVERSION DEVICE

(75) Inventor: Atsuko Kume, Sagamihara (JP)

(73) Assignee: Olympus Corporation, Tokyo (JP)

( * ) Notice: Subject to any disclaimer, the term of this patent is extended or adjusted under 35 U.S.C. 154(b) by 292 days.

(21) Appl. No.: 12/892,090

(22) Filed: Sep. 28, 2010

(65) Prior Publication Data

US 2011/0233381 A1 Sep. 29, 2011

(30) Foreign Application Priority Data

Sep. 28, 2009 (JP) ................................. 2009-221774

(51) Int. Cl.
*H04N 3/14* (2006.01)
*H01L 27/00* (2006.01)

(52) U.S. Cl.
USPC ....................................... 348/294; 250/208.1

(58) Field of Classification Search .................. 348/308, 348/294; 250/208.1, 214.1; 341/126
See application file for complete search history.

(56) References Cited

U.S. PATENT DOCUMENTS

| 5,396,247 | A | 3/1995 | Watanabe et al. |
| 7,671,313 | B2 | 3/2010 | Watanabe |
| 2006/0243885 | A1 | 11/2006 | Watanabe |
| 2006/0273831 | A1 | 12/2006 | Maksimovic et al. |
| 2009/0244338 | A1 | 10/2009 | Kume |
| 2010/0073542 | A1 | 3/2010 | Watanabe |
| 2010/0110252 | A1 | 5/2010 | Shimomura et al. |
| 2011/0169988 | A1 | 7/2011 | Tanaka |

FOREIGN PATENT DOCUMENTS

| JP | 03-060073 A | 3/1991 |
| JP | 5-95099 A | 4/1993 |
| JP | 2001-324390 A | 11/2001 |
| JP | 2006-287879 A | 10/2006 |
| JP | 2007-312288 A | 11/2007 |
| JP | 2008-060269 A | 3/2008 |
| JP | 2009-200546 A | 9/2009 |

OTHER PUBLICATIONS

Non—Final Office Action dated Jun. 19, 2012, issued in co-pending U.S. Appl. No. 12/877,452.
Japanese Office Action mailed Mar. 5, 2013, issued in related Japanese Patent Application No. 2009-208475, with English translation (4 pages).
Japanese Office Action mailed Feb. 5, 2013, issued in corresponding Japanese Patent Application 2009-221774, (6 pages). With English Translation.

*Primary Examiner* — Thanh Luu
*Assistant Examiner* — Renee Naphas
(74) *Attorney, Agent, or Firm* — Westerman, Hattori, Daniels & Adrian, LLP

(57) ABSTRACT

An electric conversion device may include A/D converters each of which includes a pulse delay circuit and an encoder, the pulse delay circuit including delay units each of which delaying a pulse signal with a delay time based on the difference between a voltage of a pixel signal and a reference voltage, the delay units being connected so that the pulse signal can circulate through the delay units, the encoder outputting a digital value based on the number of the delay units that the pulse signal passes through within a predetermined period of time. The encoder may include a latch circuit that includes latch units storing delay information, the delay information being output when the pulse signal passes through each of the delay units, an encoder unit that outputs the digital value based on the delay information, and a counter unit that counts the number of circulations.

18 Claims, 10 Drawing Sheets

PHOTOELECTRIC CONVERSION DEVICE

BACKGROUND OF THE INVENTION

1. Field of the Invention

The present invention relates to a photoelectric conversion device used in a digital camera, a digital video camera, an endoscope, and the like.

Priority is claimed on Japanese Patent Application. No. 2009-221774, filed Sep. 28, 2009, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Conventionally, a solid-state image-pickup device is used as a photoelectric conversion device used in a digital camera, a digital video camera, an endoscope, and the like. Digital cameras, digital video cameras, endoscopes, and the like including the solid-state image-pickup device are increasingly being made smaller and with reduced power consumption. Therefore, there is a need to make the solid-state image-pickup device smaller and with reduced power consumption.

To response to this need, Japanese Unexamined Patent Application, First Publication, No. 2006-287879 discloses a solid-state image-pickup device that internally incorporates an A/D converter configured as a digital circuit.

FIG. 9 is a block diagram illustrating a schematic configuration of a solid-state image-pickup device in accordance with the related art. The solid-state image-pickup device includes a plurality of array blocks (subarrays) arranged in two dimensions. As an example, in the solid-state image-pickup device of FIG. 9, the array blocks (subarrays) B1, B2, ..., B20 are arranged in four rows and five columns. Each array block (subarray) includes a two-dimensionally arranged pixel block 90 in which a photoelectric conversion element outputs a pixel signal in accordance with an incident light amount, and an A/D converter 91 that converts the pixel signal output from the pixel of the pixel block 90 from analog to digital.

FIG. 10 is a block diagram illustrating an example of a circuit configuration of an A/D converter 91 included in each of the array blocks (subarrays) of FIG. 9. The A/D converter 91 includes a delay circuit 901 and an encoder 902. The delay circuit 901 includes a plurality of delay units, each of which includes various types of gate circuits, and the delay units are connected in a ring shape. An input signal (input voltage) that will be the object of an analog-digital conversion is input to each delay unit in the delay circuit 901 as a drive voltage for the delay units. Also, a reference voltage is supplied to each delay unit in the delay circuit 901.

In the A/D converter 91 of FIG. 10, if, for example, the reference voltage of the delay circuit 901 is GND, and a high-level signal is input as the input pulse signal φPL, then the input pulse signal φPL will have a delay time that corresponds to the voltage difference between the input signal and the reference voltage (GND) as it passes sequentially through the delay units and circulates around the delay circuit 901. If the input pulse signal φPL is set to the low level, then it will stop circulating around the delay circuit 901.

When the input pulse signal φPL is circulating around the delay circuit 901, the number of stages of the delay units that the input pulse signal φPL passes through within a predetermined period of time is determined based on the delay time of the delay units, i.e. the voltage difference between the input signal and the reference voltage (GND). The encoder 902 detects the passed number of stages of delay units (and the number of circulations).

The encoder 902 includes a counter circuit 9021, a latch and encoder circuit 9022, and an adder 9023. The counter circuit 9021 counts the number of circulations of the input pulse signal φPL around the delay circuit 901. The latch and encoder circuit 9022 detects the number of stages of the input pulse signal φPL travelling around the delay circuit 901. The counter circuit 9021 outputs, for example, a bits of upper bit data. The latch and encoder circuit 9022 outputs, for example, b bits of lower bit data. The adder 9023 outputs a+b bits of digital data. The output value of the adder 9023 becomes a digital value after analog-digital conversion in accordance with the voltage of the input signal. In the solid-state image-pickup device of FIG. 9, the pixel signal output from the pixel block 90 is used as the input signal of the A/D converter 91, whereby a digital value in accordance with the incident light amount is output.

When an A/D converter is mounted in a solid-state image-pickup device, an A/D converter is sometimes provided for each column of the pixel blocks that arrange photoelectric conversion elements in a two-dimensional array. When an A/D converter is provided for each column of pixel blocks in this manner, each one must be arranged longitudinally.

When the A/D converter is arranged longitudinally, the distance between the delay units contained in the delay circuit inside the A/D converter and the latch circuit contained in the latch and encoder circuit will vary in each delay unit stage. FIG. 11 is a block diagram schematically illustrating an example of a layout of constituent components in an A/D converter included in a solid-state image-pickup device in accordance with the related art. Let us consider a case where the delay units and the latch units in the latch circuit are arranged as illustrated in FIG. 11. In FIG. 11, distance a is the distance between the delay units, distance b is the distance between the latch units, and distance c is the distance between the last-stage delay unit Dn and the first-stage latch unit L1. The length of the signal wire interconnection between the delay units and the latch units differs in each stage.

More specifically, the interconnection length d1 of the first-stage delay unit D1 is 3a+c. The interconnection length d2 of the second-stage delay unit D2 is 2a+b+c. The interconnection length d3 of the third-stage delay unit D3 is a+2b+c. The interconnection length do of the nth-stage delay unit Dn is 3b+c. In FIG. 11, the interconnection lengths in the left and right direction of each stage are equal.

SUMMARY

An electric conversion device may include a pixel array that includes a plurality of pixels arranged two-dimensionally, each of the plurality of pixels having a photoelectric conversion element, the pixel array outputting a pixel signal in accordance with an incident light amount to the photoelectric conversion element, and a plurality of A/D converters each of which includes a pulse delay circuit and an encoder, the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time. The encoder may include a latch circuit that includes a plurality of latch units each of which corresponds to the plurality of delay units, each of the plurality of latch units storing delay information, the delay information being output when the pulse signal passes through each of the plurality of delay units, an encoder unit that outputs the digital value based on the delay information, and a counter unit that counts the number of circulations of the pulse signal passing through the plurality of delay units within a predetermined period of time the counter unit outputting the digital value based on the number of circulations. Each of the plurality of delay units and each of the plurality of latch units corresponding to each of the plurality of delay units may be arranged adjacently in a first direction of the pixel array to configure each of a plurality of delay detectors. The plurality of delay detectors may be arranged adjacently in the first direction.

A last-stage delay detector including a last-stage delay unit may be arranged in the first direction so as to be arranged adjacently to the counter unit.

A reference voltage wire that supplies the reference voltage to each of the plurality of A/D converters may be branched to be a plurality of branched reference voltage wires. Each of the plurality of branched reference voltage wires may correspond to each constituent component in the plurality of A/D converters. Each of the plurality of branched reference voltage wires may be connected to a corresponding constituent component in the plurality of A/D converters.

The reference voltage wire may be arranged to extend in the first direction. A plurality of branch points may be arranged in the first direction. Each of the plurality of branched reference voltage wires may be separated from the reference voltage wire at each of the plurality of branch points. Each of the plurality of branched reference voltage wires may be arranged to extend in a second direction of the pixel array that is different from the first direction. The plurality of A/D converters may be arranged in the second direction. A plurality of first connection points and a second connection point may be arranged in the first direction. Each of the plurality of delay detectors may be connected to each of the plurality of branched reference voltage wires at each of the plurality of first connection points. The counter unit may be connected to each of the plurality of branched reference voltage wires at the second connection point.

A reference voltage wire that supplies the reference voltage to each of the plurality of A/D converters may be branched to a first branched reference voltage wire and a second branched reference voltage wire. The first branched reference voltage wire may correspond to the pulse delay circuit. The second branched reference voltage wire may correspond to a corresponding encoder. The first branched reference voltage wire may be connected to the corresponding pulse delay circuit. The second branched reference voltage wire may be connected to the corresponding encoder.

The first branched reference voltage wire may be branched to a plurality of third branched reference voltage wires each of which corresponds to a first constituent component of the pulse delay circuit. Each of the plurality of third branched reference voltage wires may be connected to the corresponding first constituent component. The second branched reference voltage wire may be branched to a plurality of fourth branched reference voltage wires each of which corresponds to a second constituent component of the encoder. Each of the plurality of fourth branched reference voltage wires may be connected to the corresponding second constituent component. The first branched reference voltage wire may be arranged to extend in the first direction. The second branched reference voltage wire may be arranged to extend in the first direction. Each of the plurality of third branched reference voltage wires may be arranged to extend in a second direction of the pixel array that is different from the first direction. Each of the plurality of fourth branched reference voltage wires may be arranged to extend in the second direction of the pixel array that is different from the first direction. The plurality of A/D converters may be arranged in the second direction. A plurality of first connection points and a second connection point may be arranged in the first direction. Each of the plurality of delay detectors may be connected to one of the plurality of third branched reference voltage wires and the plurality of fourth branched reference voltage wires at each of the plurality of first connection points. The counter unit may be connected to each of the plurality of fourth branched reference voltage wires at the second connection point.

A reference voltage wire that supplies the reference voltage to each of the plurality of A/D converters may be branched to a first branched reference voltage wire and a second branched reference voltage wire. The first branched reference voltage wire may correspond to the pulse delay circuit. The second branched reference voltage wire may correspond to the encoder. The first branched reference voltage wire may be branched to a plurality of third branched reference voltage wires each of which corresponds to the pulse delay circuit. The second branched reference voltage wire may be branched to a plurality of fourth branched reference voltage wires, each of which corresponds to a constituent component in the encoder. Each of the third branched reference voltage wires may be connected only to the corresponding pulse delay circuit. Each of the fourth branched reference voltage wire may be connected to the corresponding constituent component.

The first branched reference voltage wire may be arranged to extend in a second direction of the pixel array that is different from the first direction. The second branched reference voltage wire may be arranged to extend in the first direction. A first branch point may be arranged in the second direction. Each of the plurality of third branched reference voltage wires may be separated from the first branched reference voltage wire at the first branch point. A second branch point may be arranged in the first direction. Each of the plurality of fourth branched reference voltage wires may be separated from the second branched reference voltage wire at the second branch point. The third branched reference voltage wires may be arranged to extend in the first direction. The fourth branched reference voltage wires may be arranged to extend in the second direction. The plurality of A/D converters may be arranged in the second direction. A plurality of first connection points and a second connection point may be arranged in the first direction. Each of the plurality of delay detectors may be connected to one of the plurality of third branched reference voltage wires and the plurality of fourth branched reference voltage wires at each of the plurality of first connection points. The counter unit may be connected to each of the plurality of fourth branched reference voltage wires at the second connection point.

The first direction may be a column direction of the pixel array. A second direction may be a row direction of the pixel array. The number of the plurality of A/D converters may be based on a column number of the pixel array.

An electric conversion device may include a plurality of A/D converters each of which includes a pulse delay circuit and an encoder, the pulse delay circuit including a plurality of delay units, each of the plurality of delay units delaying a pulse signal with a delay time that is based on the difference between a voltage of a pixel signal, which is received from a pixel array, and a reference voltage, the plurality of delay units being connected so that the pulse signal can circulate through the plurality of delay units, the encoder outputting a digital value based on the number of the plurality of delay units that the pulse signal passes through within a predetermined period of time. The encoder may include a latch circuit that includes a plurality of latch units each of which corresponds to the plurality of delay units, each of the plurality of latch units storing delay information, the delay information being output when the pulse signal passes through each of the plurality of delay units, an encoder unit that outputs the digital value based on the delay information, and a counter unit that counts the number of circulations of the pulse signal passing through the plurality of delay units within a predetermined period of time, the counter unit outputting the digital value based on the number of circulations. Each of the plurality of delay units and each of the plurality of latch units corresponding to each of the plurality of delay units may be arranged adjacently in a first direction of the pixel array to configure each of a plurality of delay detectors. The plurality of delay detectors may be arranged adjacently in the first direction.

A last-stage delay detector including a last-stage delay unit may be arranged in the first direction so as to be arranged adjacently to the counter unit.

A reference voltage wire that supplies the reference voltage to each of the plurality of A/D converters may be branched to be a plurality of branched reference voltage wires. Each of the plurality of branched reference voltage wires may correspond to each constituent component in the plurality of A/D converters. Each of the plurality of branched reference voltage wires may be connected to a corresponding constituent component in the plurality of A/D converters.

The reference voltage wire may be arranged to extend in the first direction. A plurality of branch points may be arranged in the first direction. Each of the plurality of branched reference voltage wires may be separated from the reference voltage wire at each of the plurality of branch points. Each of the plurality of branched reference voltage wires may be arranged to extend in a second direction of the pixel array that is different from the first direction. The plurality of A/D converters may be arranged in the second direction. A plurality of first connection points and a second connection point may be arranged in the first direction. Each of the plurality of delay detectors may be connected to each of the plurality of branched reference voltage wires at each of the plurality of first connection points. The counter unit may be connected to each of the plurality of branched reference voltage wires at the second connection point.

A reference voltage wire that supplies the reference voltage to each of the plurality of A/D converters may be branched to a first branched reference voltage wire and a second branched reference voltage wire. The first branched reference voltage wire may correspond to the pulse delay circuit. The second branched reference voltage wire may correspond to a corresponding encoder. The first branched reference voltage wire may be connected to the corresponding pulse delay circuit. The second branched reference voltage wire may be connected to the corresponding encoder.

The first branched reference voltage wire may be branched to a plurality of third branched reference voltage wires each of which corresponds to a first constituent component of the pulse delay circuit. Each of the plurality of third branched reference voltage wires may be connected to the corresponding first constituent component. The second branched reference voltage wire may be branched to a plurality of fourth branched reference voltage wires each of which corresponds to a second constituent component of the encoder. Each of the plurality of fourth branched reference voltage wires may be connected to the corresponding second constituent component. The first branched reference voltage wire may be arranged to extend in the first direction. The second branched reference voltage wire may be arranged to extend in the first direction. Each of the plurality of third branched reference voltage wires may be arranged to extend in a second direction of the pixel array that is different from the first direction. Each of the plurality of fourth branched reference voltage wires may be arranged to extend in the second direction of the pixel array that is different from the first direction. The plurality of A/D converters may be arranged in the second direction. A plurality of first connection points and a second connection point may be arranged in the first direction. Each of the plurality of delay detectors may be connected to one of the plurality of third branched reference voltage wires and the plurality of fourth branched reference voltage wires at each of the plurality of first connection points. The counter unit may be connected to each of the plurality of fourth branched reference voltage wires at the second connection point.

A reference voltage wire that supplies the reference voltage to each of the plurality of A/D converters may be branched to a first branched reference voltage wire and a second branched reference voltage wire. The first branched reference voltage wire may correspond to the pulse delay circuit. The second branched reference voltage wire may correspond to the encoder. The first branched reference voltage wire may be branched to a plurality of third branched reference voltage wires each of which corresponds to the pulse delay circuit. The second branched reference voltage wire may be branched to a plurality of fourth branched reference voltage wires, each of which corresponds to a constituent component in the encoder. Each of the third branched reference voltage wires may be connected only to the corresponding pulse delay circuit. Each of the fourth branched reference voltage wire may be connected to the corresponding constituent component.

The first branched reference voltage wire may be arranged to extend in a second direction of the pixel array that is different from the first direction. The second branched reference voltage wire may be arranged to extend in the first direction. A first branch point may be arranged in the second direction. Each of the plurality of third branched reference voltage wires may be separated from the first branched reference voltage wire at the first branch point. A second branch point may be arranged in the first direction. Each of the plurality of fourth branched reference voltage wires may be separated from the second branched reference voltage wire at the second branch point. The third branched reference voltage wires may be arranged to extend in the first direction. The fourth branched reference voltage wires may be arranged to extend in the second direction. The plurality of A/D converters may be arranged in the second direction. A plurality of first connection points and a second connection point may be arranged in the first direction. Each of the plurality of delay detectors may be connected to one of the plurality of third branched reference voltage wires and the plurality of fourth branched reference voltage wires at each of the plurality of first connection points. The counter unit may be connected to each of the plurality of fourth branched reference voltage wires at the second connection point.

The first direction may be a column direction of the pixel array. A second direction may be a row direction of the pixel array. The number of the plurality of A/D converters may be based on a column number of the pixel array.

An electric conversion device may include a pixel array that includes a plurality of pixels arranged two-dimensionally, each of the plurality of pixels having a photoelectric conversion element, the pixel array outputting a pixel signal in accordance with an incident light amount to the photoelectric conversion element, a plurality of A/D converters each of which includes a pulse delay circuit and an encode; the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, a reference voltage wire that supplies the reference voltage to each of the plurality of A/D converters. The encoder may include a latch circuit that includes a plurality of latch units each of which corresponds to the plurality of delay units, each of the plurality of latch units storing delay information, the delay information being output when the pulse signal passes through each of the plurality of delay units, an encoder unit that outputs the digital value based on the delay information, and a counter unit that counts the number of circulations of the pulse signal passing through the plurality of delay units within a predetermined period of time the counter unit outputting the digital value based on the number of circulations. Each of the plurality of delay units and each of the plurality of latch units corresponding to each of the plurality of delay units may be arranged adjacently in a first direction of the pixel array to configure each of a plurality of delay detectors. The plurality of delay detectors may be arranged adjacently in the first direction. The reference voltage wire may be branched to be a plurality of branched reference voltage wires. Each of the plurality of branched reference voltage wires may correspond to each constituent component in the plurality of A/D converters. Each of the plurality of branched reference voltage wires may be connected to a corresponding constituent component in the plurality of A/D converters.

The reference voltage wire may be arranged to extend in the first direction. A plurality of branch points may be arranged in the first direction. Each of the plurality of branched reference voltage wires may be separated from the reference voltage wire at each of the plurality of branch points. Each of the plurality of branched reference voltage wires may be arranged to extend in a second direction of the pixel array that is different from the first direction. The plurality of A/D converters may be arranged in the second direction. A plurality of first connection points and a second connection point may be arranged in the first direction. Each of the plurality of delay detectors may be connected to each of the plurality of branched reference voltage wires at each of the plurality of first connection points. The counter unit may be connected to each of the plurality of branched reference voltage wires at the second connection point.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred Embodiment

Figure 1:
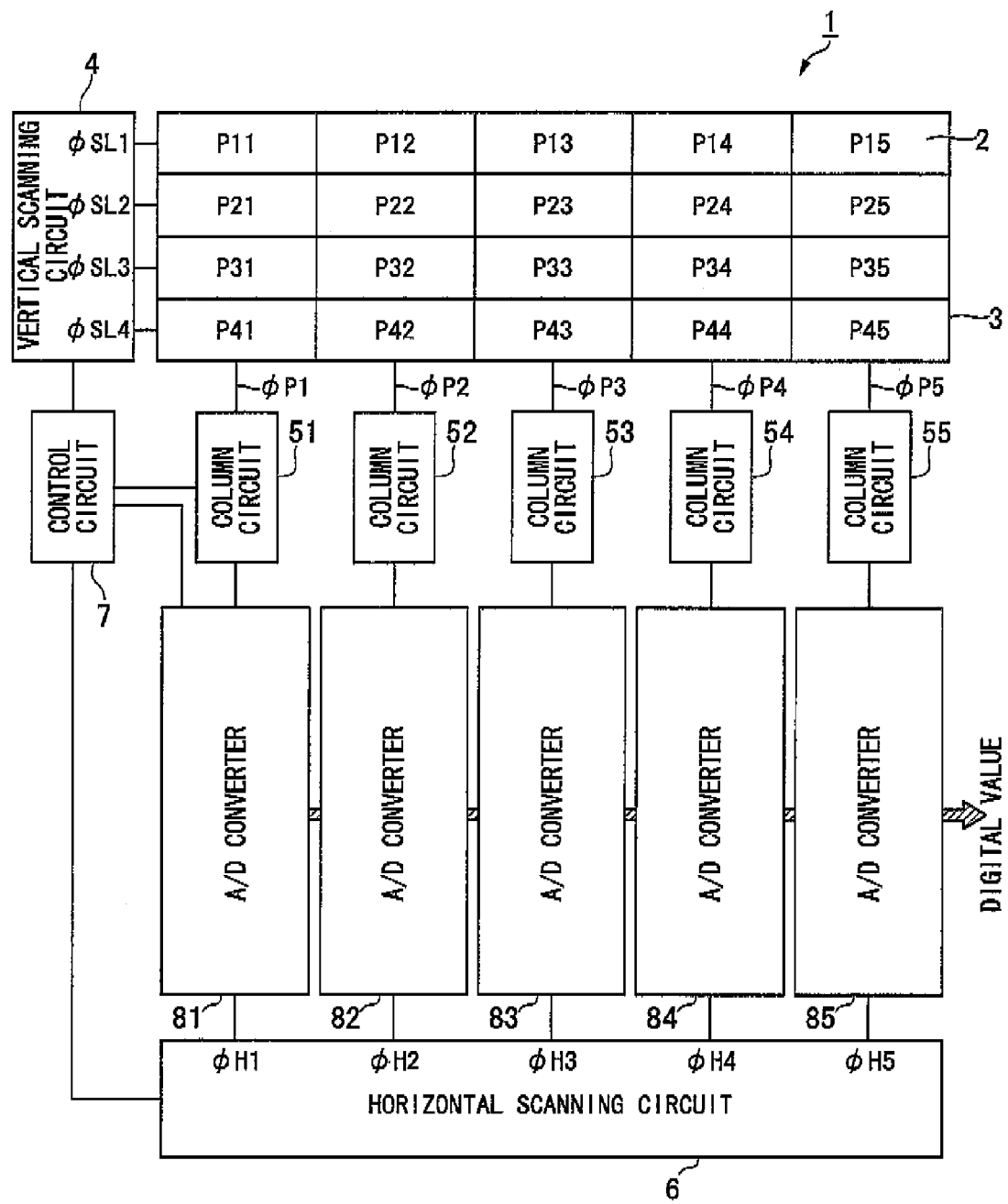
FIG. 1 is a block diagram illustrating a schematic configuration of a photoelectric conversion device in accordance with a first preferred embodiment of the present invention.

A first preferred embodiment of the present invention will be described. FIG. 1 is a block diagram illustrating a schematic configuration of a photoelectric conversion device 1 in accordance with a first preferred embodiment of the present invention. In FIG. 1, the photoelectric conversion device 1 includes pixels P11, . . . , P45, a vertical scanning circuit 4, column circuits 51, . . . , 55, a horizontal scanning circuit 6, a control circuit 7, and A/D converters 81, . . . , 85. The A/D converter may be hereinafter referred to as an ADC. In the photoelectric conversion device 1 of FIG. 1, the pixels P11, . . . , P45 are arranged two-dimensionally in four rows and five columns to form a pixel array 3. Pixel 2 indicates any one of the pixels P11, . . . , P45. Column circuit 5 indicates any one of the column circuits 51, . . . , 55. ADC 8 indicates any one of the ADCs 81, . . . , 85.

The pixels P11, . . . , P45 are photoelectric conversion elements. If the vertical scanning circuit 4 selects the pixel 2, then the pixel 2 outputs a pixel output signal at a level in accordance with the incident light amount. The pixels P11, . . . , P45 also output pixel output signals φP1, . . . , φP5 for each pixel column in the pixel array 3. The first numerical digit that follows 'pixel P' indicates the number of that row in the pixel array 3, and the last numerical digit indicates the number of the column.

The column circuits 51, ..., 55 are respectively disposed in each pixel column of the pixel array 3. The column circuits 51, ..., 55 process the pixel output signal read from the pixel 2, and output it to the ADC 81, ..., 85 of the corresponding pixel column. The numerical digit that follows 'column circuit 5' of the column circuits 51, ..., 55 indicates the number of the column in the pixel array 3.

The ADCs 81, ..., 85 are A/D converters, and are disposed in each pixel column in the pixel array 3. The ADCs 81, ..., 85 each receive a processed pixel signal from their respective column circuits 51, ..., 55, subject it to an analog-digital conversion, and output a converted digital value. The numerical digit that follows 'ADC 8' of the ADCs 81, ..., 85 indicates the number of the column in the pixel array 3. The ADC 8 will be explained in more detail later.

The vertical scanning circuit 4 receives a vertical control signal from the control circuit 7. In accordance with this vertical control signal received from the control circuit 7, the vertical scanning circuit 4 selects a row of the pixel 2 for reading from the pixel array 3. The vertical scanning circuit 4 outputs a row selection signal φSL1, ..., φSL4 that corresponds to the row of the pixel 2 for reading from the pixel array 3. For example, when the first row of the pixel array 3 is selected, the vertical scanning circuit 4 sets row selection signal φSL1 to the select level (e.g. the high level) and outputs it to the pixel array 3; meanwhile, it sets the unselected row selection signals φSL2, ..., φSL4 to the non-selected level (e.g. the low level) and outputs them to the pixel array 3.

The horizontal scanning circuit 6 receives a horizontal control signal from the control circuit 7. In accordance with the horizontal control signal received from the control circuit 7, the horizontal scanning circuit 6 makes the ADCs 81, ..., 85 output the digital values, which are converted by the ADCs 81, ..., 85 from analog to digital, in each column based on the horizontal control signal received from the control circuit 7, and sets this output as the output of the photoelectric conversion device 1. The horizontal scanning circuit 6 outputs column selection signals φH1, ..., φH5, which corresponds to the column of the digital value for reading from the ADC 8, to the ADC 8. For example, when outputting the digital value of the first column of the pixel array 3, the horizontal scanning circuit 6 sets column selection signal φH1 to the select level (e.g. the high level) and outputs it to the ADC 81; meanwhile, it sets the unselected column selection signals φH2, ..., φH5 to the non-selected level (e.g. the low level) and outputs them to the ADCs 82, ..., 85. The horizontal scanning circuit 6 then sequentially outputs the column selection signals φH2, ..., φH5 at the output permission level (e.g. the high level), and the other column selection signals φH1, ..., φH5 corresponding to the non-output columns at the output not-permitted level (e.g. the low level), to the ADC 8. In this way, the horizontal scanning circuit 6 makes the ADC 8 sequentially output the digital data values it converted.

The control circuit 7 controls the entire photoelectric conversion device 1. In accordance with an image capture command from an external unit that is not illustrated in the figures, the control circuit 7 outputs a vertical control signal for controlling the vertical scanning circuit 4 and a horizontal control signal for controlling the horizontal scanning circuit 6.

The control circuit 7 also controls the operations (start and stop) of the column circuit 5 and the ADC 8.

Figure 2:
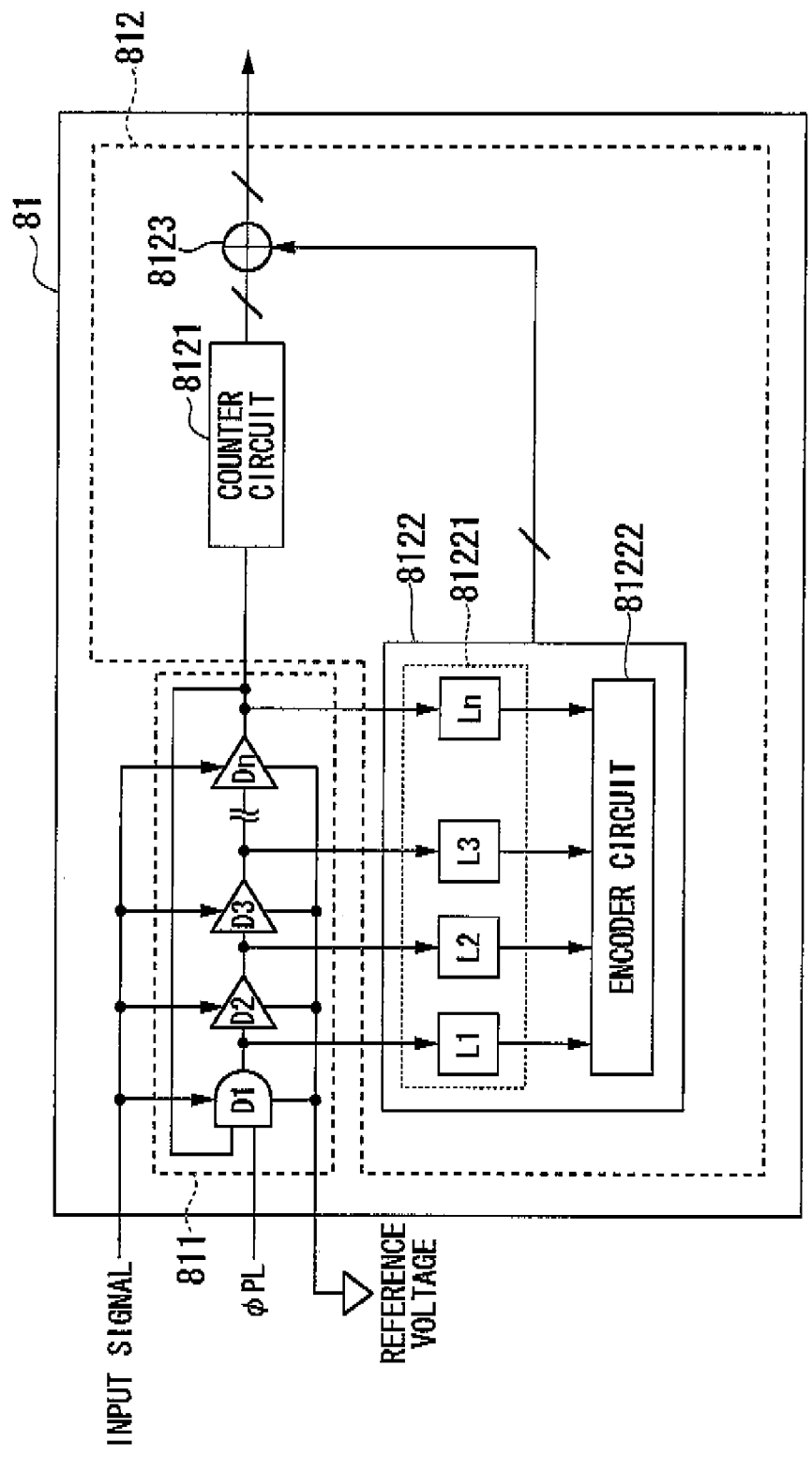
FIG. 2 is a block diagram illustrating a schematic configuration of the A/D converter included in the photoelectric conversion device in accordance with the first preferred embodiment of the present invention.

Subsequently, the A/D converter of the photoelectric conversion device 1 in accordance with the first preferred embodiment of the present invention will be described. FIG. 2 is a block diagram illustrating a schematic configuration of the A/D converter included in the photoelectric conversion device 1 in accordance with the first preferred embodiment of the present invention. Of the A/D converters included in the pixel columns of the photoelectric conversion device 1, by way of example FIG. 2 shows ADC 81 that corresponds to the first column of the pixel array 3. The configurations of the ADCs 82, ..., 85 corresponding to the other pixel columns are the same as that of ADC 81 illustrated in FIG. 2.

In FIG. 2, the ADC 81 includes a delay circuit 811 and an encoder 812. The encoder 812 includes a counter circuit 8121, a latch and encoder circuit 8122, and an adder 8123. The latch and encoder circuit 8122 includes a latch circuit 81221 and an encoder circuit 81222 for each delay unit in the delay circuit 811.

In accordance with a timing signal for starting analog-digital conversion that is not illustrated in the figures, the ADC 81 subjects a pixel signal received from the column circuit 51 to analog-digital conversion. In accordance with a timing signal for stopping analog-digital conversion that is not illustrated in the figures, the digital value of the pixel signal that was subjected to analog-digital conversion is stored in an output control circuit, which is not illustrated in the figures, in the ADC 81. The ADC 81 outputs the digital value stored in the output control circuit, which is not illustrated in the figures, in accordance with a column selection signal φH1 received from the horizontal scanning circuit 6.

The delay circuit 811 is a ring delay line (RDL) wherein a plurality of delay units are connected in a ring shape. Each of the plurality of delay units includes various types of gate circuits. The plurality of delay units include, for example, NAND circuits and INV circuits. They include a delay unit D1 provided in a first stage of the configuration of the delay circuit 811, and a plurality of delay units D2, D3, ..., Dn each of which includes two INV circuits and provided in second and subsequent stages of the configuration of the delay circuit 811. An input signal (voltage) that becomes the object of analog-digital conversion is supplied as a drive voltage to each delay unit in the delay circuit 811. Also, a reference voltage is supplied to each delay unit in the delay circuit 811. In FIG. 2, the reference voltage is at ground (GND) level.

For example, if a high-level signal is input as the input pulse signal φPL of the delay circuit 811, then the input pulse signal φPL will have a delay time that corresponds to the voltage difference between the input signal and the reference voltage (GND) as it passes sequentially through the delay units and circulates around the delay circuit 811. When the input pulse signal φPL is circulating around the delay circuit 811, the number of stages of delay units that the input pulse signal φPL passes through within a predetermined period of time is determined according to the delay time of the delay units, i.e. the voltage difference between the input signal and the reference voltage (GND in this example).

The encoder 812 detects the number of stages of delay units that the input pulse signal φPL passed in the delay circuit 811 and the number of circulations of the input pulse signal φPL around the delay circuit 811, and outputs a digital value which is the result of an analog-digital conversion of the number of passed stages and number of circulations performed by the ADC 81.

In accordance with a timing signal for completing analog-digital conversion, which is not illustrated in the figures, that is input after a predetermined time elapses, the latch circuit 81221 stores output data of each delay unit in the delay circuit 811. The latch circuit 81221 includes latch units L1, L2, L3, ..., Ln corresponding to each of the delay units D1, D2, D3, ..., Dn in the delay circuit 811. The latch units L1, L2, L3, ..., Ln store output data of their corresponding delay unit, in accordance with the timing signal for completing analog-digital conversion. In FIG. 2, the latch unit L1 stores the output value of its corresponding delay unit D1, the latch unit L2 stores the output value of its corresponding delay unit D2, the latch unit L3 stores the output value of its corresponding delay unit D3, and the latch unit Ln stores the output value of its corresponding delay unit Dn.

From the values stored by the latch circuit 81221, the encoder circuit 81222 detects the number of delay unit stages that the input pulse signal φPL passed inside the delay circuit 811. Based on the change in the output value of the delay unit Dn in the last stage of the delay circuit 811, the counter circuit 8121 detects the number of circulations of the delay circuit 811 made by the input pulse signal φPL. The adder 8123 outputs a digital signal that combines two signals, with the number of circulations of the input pulse signal φPL output from the counter circuit 8121 as its upper bit and the number of passed stages of the input pulse signal φPL output from the latch and encoder circuit 8122 as its lower bit. The output value of the adder 8123 becomes the digital value after analog-digital conversion in accordance with the voltage of the input signal.

A signal which has the same level as the reference voltage (GND in this example) supplied to each delay unit in the delay circuit 811 to the GND terminal of the encoder 812 is supplied to the GND terminal of the encoder 812. In FIG. 2, the reference voltage and GND (grounding) have the same potential. Hereinafter, the potential wire of the reference voltage (GND in this example) and the potential wire of the GND potential are referred to as 'reference voltage wire'.

In accordance with a timing signal for completing analog-digital conversion that is not illustrated in the figures, the digital value output from the adder 8123 is stored in an output control circuit, which is not illustrated in the figures, in the ADC 81. In the photoelectric conversion device 1 of FIG. 1, the ADC 81 receives a processed pixel signal from the column circuit 51 arranged in the first column of the pixel array 3, subjects it to an analog-digital conversion, and outputs a digital value that is in accordance with amount of light incident to the pixel 2 in the first column.

In the same manner as the ADC 81, the ADCs 82, ..., 85 receive a processed pixel signal from the column circuits 52, ..., 55 arranged in respectively corresponding columns of the pixel array 3, and output an A/D converted digital value that is in accordance with the amount of light incident to the pixel 2 in the 2nd, 3rd, ..., 5th columns.

Figure 3:
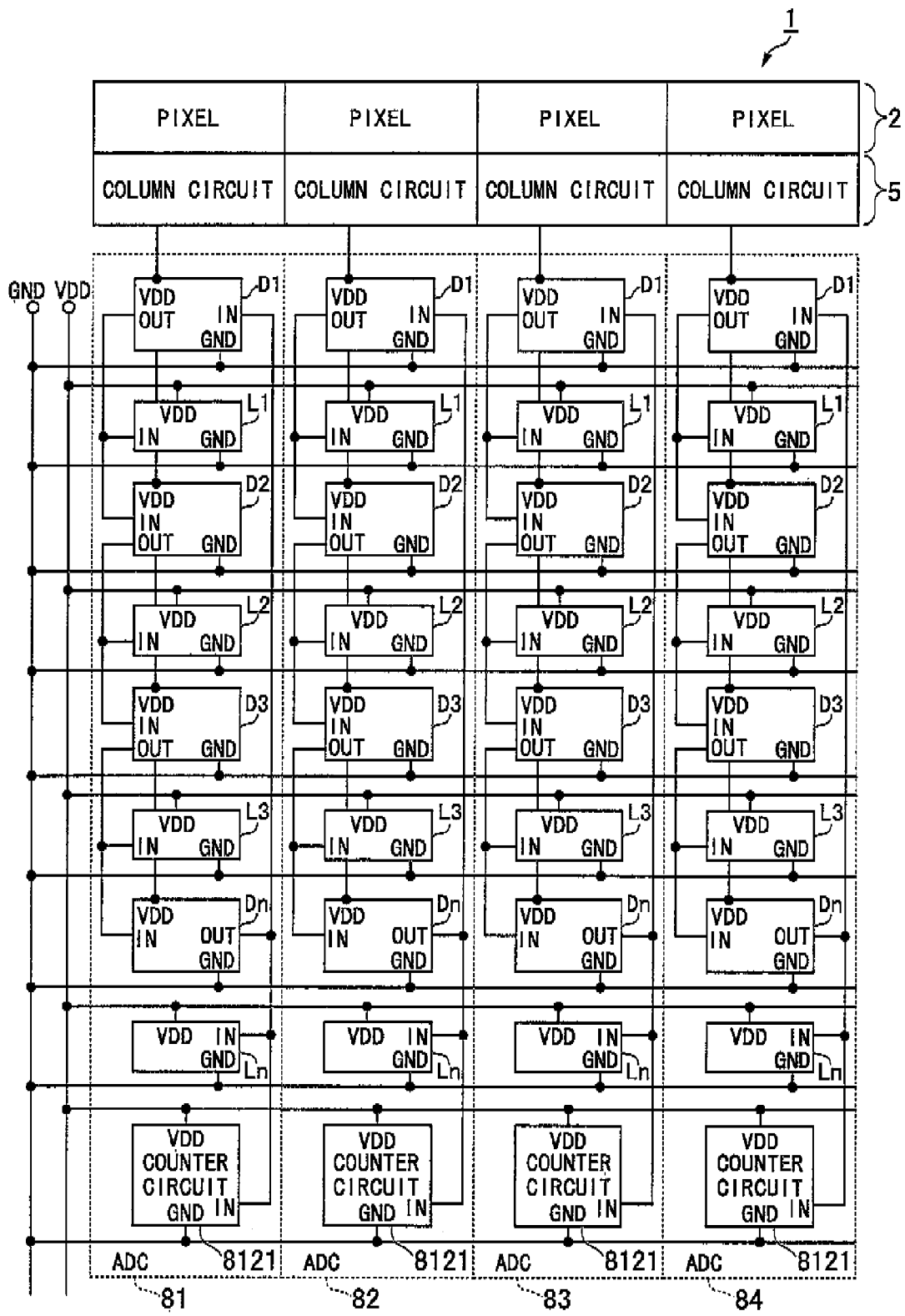
FIG. 3 is a block diagram schematically illustrating an example of a layout of constituent components in an A/D converter included in the photoelectric conversion device in accordance with the first preferred embodiment of the present invention.

Subsequently, the layout of the constituent components in an A/D converter of the photoelectric conversion device 1 according to the first embodiment of the invention will be described. FIG. 3 is a block diagram schematically illustrating an example of a layout of constituent components in an A/D converter included in the photoelectric conversion device 1 in accordance with the first preferred embodiment of the present invention. FIG. 3 shows only some of the constituent components in the photoelectric conversion device 1 illustrated in FIG. 1, and omits those that are not directly relevant to the present invention. Specifically, FIG. 3 shows four columns of the pixel array 3 and omits the rows of the pixel array 3. Only the pixel 2, the column circuit 5, and the ADC 8 are illustrated, other constituent components contained in the photoelectric conversion device 1 illustrated in FIG. 1 being omitted. FIG. 3 shows the connections between the power voltage wire (VDD) connected to the power terminal of the constituent components in the ADC 8, the reference voltage wire (GND) connected to the GND terminal, and the delay units D1, ..., Dn in the delay circuit 811 and the counter circuit 8121 and the latch units L1, ..., Ln in the latch circuit 81221, while omitting the connections with the other constituent components in the photoelectric conversion device 1 and in the ADC 8.

As illustrated in FIG. 3, in the ADC 8, each of the delay units D1, ..., Dn in the delay circuit 811 is paired with each of the latch units L1, ..., Ln in the corresponding latch circuit 81221, and these are arranged adjacently. Specifically, the delay unit D1 and the latch unit L1 that holds the output value of the delay unit D1 are arranged adjacently. The delay unit D2 and the latch unit L2 that holds the output value of the delay unit D2 are arranged adjacently. The delay unit D3 and the latch unit L3 that holds the output value of the delay unit D3 are arranged adjacently. The delay unit Dn and the latch unit Ln that holds the output value of the delay unit Dn are arranged adjacently. Hereinafter, 'delay detector DL' will denote a pair including a delay unit and its corresponding latch unit. The numerical digit that follows the delay detector DL indicates the stage number of the delay unit and the latch unit. For example, 'delay detector DL1' indicates a pair including the first-stage delay detector D1 and the latch unit L1 that holds the output value of the first-stage delay detector D1. 'Delay detector DL' indicates one of the delay detectors DL1 to DLn without indicating the stage number of the delay unit and the latch unit.

The delay detectors DL1 to DLn are arranged in the column direction of the pixel array 3. The counter circuits 8121 are arranged in the column direction of the pixel array 3. The encoder 81222 and the adder 8123, which are not illustrated in FIG. 3, are then provided.

As illustrated in FIG. 3, in the photoelectric conversion device 1, the power voltage wire (VDD) and the reference voltage wire (GND) are arranged such as to extend in the column direction of the pixel array 3. The power voltage wire (VDD) and the reference voltage wire (GND) are then branched for use in each stage of the constituent components of the ADC 8, and extend in the row direction of the pixel array 3. After being branched for use in each stage, the power voltage wire (VDD) and the reference voltage wire (GND) are connected to the power terminal and the GDN terminal in the constituent components in each ADC 8. Incidentally, after being branched for use in each stage, the power voltage wire (VDD) and the reference voltage wire (GND) are connected to a plurality of constituent components in the same stage number in the ADC 8.

More specifically, in FIG. 3, the ADCs 8 in the photoelectric conversion device 1 are arranged from left to right in the sequence of ADC 81, ADC 82, ADC 83, ADC 84, In each ADC 8, the delay detectors DL are arranged from top to bottom in the sequence of delay detector DL1, delay detector DL2, delay detector DL3, ..., delay detector DLn. That is, the delay units D1, ..., Dn in the delay circuit 811 and the latch units L1, ..., Ln in the latch circuit 81221 are arranged such that they intersect. The counter circuit 8121 is arranged after the latch unit Ln in the delay detector DLn of the last stage. In this case, the reference voltage wire (GND) that extends in the column direction of the pixel array 3 is branched in the sequence of, from the top, use for the first-stage delay detector D1, the first-stage latch unit L1, the second-stage delay detector D3, the second-stage latch unit L2, the third-stage delay detector D3, the third-stage latch unit L3, ..., the last-stage delay unit Dn, the last-stage latch unit Ln, and the counter circuit 8121. Furthermore, the power voltage wire (VDD) that extends in the column direction of the pixel array 3 is branched in the sequence of, from the top, use for the first-stage latch unit L1, the second-stage latch unit L2, the third-stage latch unit L3, ..., the last-stage latch unit Ln, and the counter circuit 8121. The power voltage wires (VDD) and the reference voltage wires (GND) branched for the stages are arranged such as to extend in the row direction of the pixel array 3, and each of them is connected in the sequence of, from the left, constituent components in the ADC 81, constituent components in the ADC 82, constituent components in the ADC 83, constituent components in the ADC 84.

After being branched for use in the counter circuit 8121, the power voltage wire (VDD) and the reference voltage wire (GND) are connected to the encoder 81222 and the adder 8123, which are not illustrated in FIG. 3. In the present invention, there are no stipulations regarding the method of connecting the encoder 81222 and the adder 8123 to the power voltage wire (VDD) and the reference voltage wire (GND).

As described above, in the ADC 8, each of the delay units D1, . . . , Dn in the delay circuit 811 and each of the latch units L1, . . . , Ln in the corresponding latch circuit 81221 are paired and arranged adjacently. This makes it possible to shorten the interconnection length (distance) of the signal wire between each of the delay units D1, . . . , Dn in the delay circuit 811 and each of the latch units L1, . . . , Ln in the corresponding latch circuit 81221. Furthermore, each of the delay units D1, . . . , Dn and each of the latch units L1, . . . , Ln, constitute each of the delay detectors DL1, . . . , DLn. Thus the interconnection lengths (distances) of the signal wires between each of the delay units D1, . . . , Dn and each of the latch units L1, . . . , Ln in each of the delay detectors DL1, . . . , DLn can be made almost equal.

In the ADC 8, each of the delay units D1, . . . , Dn and each of the latch units L1, . . . , Ln constitute each of the delay detectors DL1, . . . , DLn, and the delay detectors DL1, . . . , DLn are arranged in the column direction of the pixel array 3. This makes it possible to shorten the interconnection length (distance) of the signal wire between the delay detectors DL1, . . . , DLn, and to make the interconnection lengths (distances) of the signal wires between the delay detectors DL1, . . . , DLn almost equal. Thus the output loads of the delay units in every stage can be made almost equal.

By making the output loads of the delay units D1, . . . , Dn in every stage almost equal in this manner, when the ADC 8 is operating, the output delay amounts of the output signals from the delay units D1, . . . , Dn that the latch units L1, . . . , Ln hold can be made almost equal. The output delay amount expresses the output delay amount of positional information in each stage relating to the input pulse signal φPL circulating in the delay circuit 811 with a delay time corresponding to the voltage difference between the input signal and the reference voltage wire (GND in this example). Each of the latch units L1, . . . , Ln in the ADC 8 can thus hold the correct positional information output from each of the delay units D1, . . . , Dn.

Figure 4:
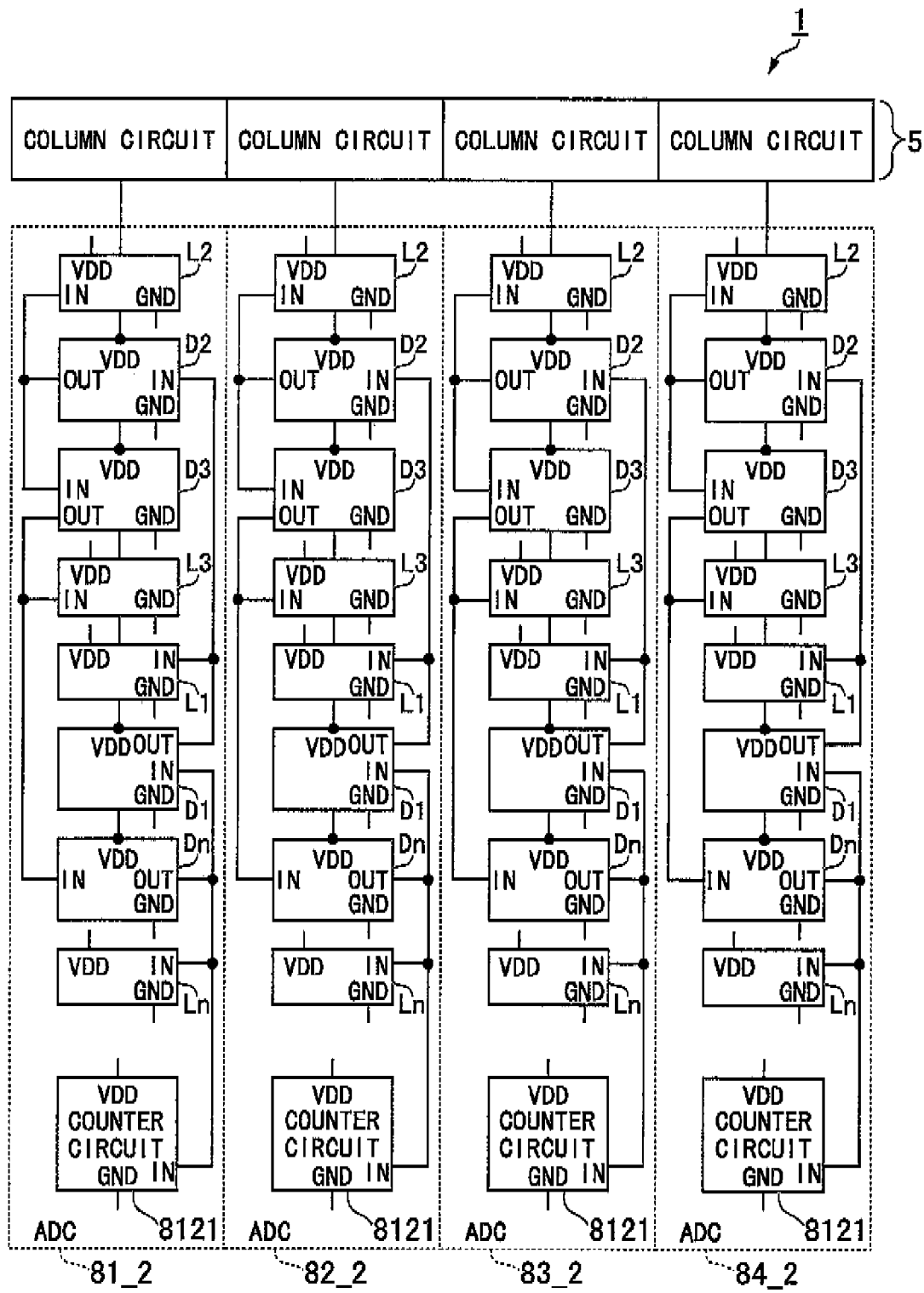
FIG. 4 is a block diagram illustrating another example of a layout of constituent components in an A/D converter in the photoelectric conversion device in accordance with the first preferred embodiment of the present invention.

Subsequently, another example of a layout of constituent components in an A/D converter in the photoelectric conversion device 1 in accordance with a first preferred embodiment of the present invention will be described. FIG. 4 is a block diagram illustrating another example of a layout of constituent components in an A/D converter in the photoelectric conversion device 1 in accordance with the first preferred embodiment of the present invention. In the example layout in the A/D converter illustrated in FIG. 4, the ADCs 81, . . . , 84 of FIG. 3 have been replaced with A/D converters (ADCs) 81_2, 84_2. 'ADC 8_2' indicates one of the ADCs 81_2, . . . , 84_2. The ADC 8_2 has the same configuration as the ADC 8 of FIG. 3.

In FIG. 4, as in FIG. 3, only some of the constituent components in the photoelectric conversion device 1 of FIG. 1 are illustrated. In addition, FIG. 4 omits the pixel 2, the power voltage wire (VDD), and the reference voltage wire (GND), which are not directly relevant to the present invention, and shows only the manner of connecting the column circuit 5 and each of the delay units D1, . . . , Dn in the ADC 8_2 to each of the latch units L1, . . . , Ln and counter circuit 8121.

In FIG. 4, as in FIG. 3, each of the delay units D1, . . . , Dn in the delay circuit 811 and each of the latch units L1, . . . , Ln in the corresponding latch circuit 81221 are paired to constitute each of the delay detectors DL1, . . . , DLn, and the delay detectors DL1, . . . , DLn are arranged in the column direction of the pixel array 3. The counter circuit 8121 is also arranged in the column direction of the pixel array. As in FIG. 3, an encoder circuit 81222 and an adder 8123 are then provided.

In FIG. 4, the sequence of arranging the delay detectors DL is different from that in FIG. 3. In FIG. 3, the sequence from top to bottom in the ADC 8 was: first-stage delay detector DL1, second-stage delay detector DL2, third-stage delay detector DL3, last-stage delay detector DLn. In FIG. 4, the sequence from top to bottom in the ADC 8_2 is: second-stage delay detector DL2, third-stage delay detector DL3, first-stage delay detector DL1, last-stage delay detector DLn.

In FIG. 4, the sequence of arranging the delay units and the latch units in the delay detectors DL differs from that in FIG. 3. Specifically, in FIG. 4, while the delay detector DL3 and the delay detector DLn are arranged in the same manner as FIG. 3, the delay detector DL2 and the delay detector DL1 are arranged in reverse order to that in FIG. 3. For example, in the delay detector DL3, as in FIG. 3, the sequence from top to bottom in the ADC 8_2 is: delay unit D3, latch unit L3. Whereas, in the delay detector DL2, in reverse arrangement to that of FIG. 3, the sequence from top to bottom in the ADC 8_2 is: latch unit L2, delay unit D2.

As described above, the delay detectors DL arranged in the ADC 8_2 are arranged irrespective of the sequence of the stages of the delay units D1, . . . , Dn. Moreover, the arrangement of the delay units D1, . . . , Dn and the latch units L1, . . . , Ln in the delay detectors DL is reversed. This makes it possible to reduce the difference between the interconnection lengths (distance) of the signal wires of the delay detectors DL. For example, in FIG. 3, the interconnection length of the signal wire from the last-stage delay detector DLn to the first-stage delay detector DL1 (maximum interconnection length) is longer than the interconnection lengths from the first-stage delay detector DL1 to the second-stage delay detector DL2, from the second-stage delay detector DL2 to the third-stage delay detector DL3, and from the third-stage delay detector DL3 to the last-stage delay detector DLn. Thus the output load of the last-stage delay unit Dn has a larger value than the output loads of the first-stage delay unit D1, the second-stage delay unit D2, and the third-stage delay unit D3. In contrast, in FIG. 4, while the lengths of the interconnections between the delay detectors DL are not equal, the interconnection length of the signal wire from the last-stage delay detector DLn to the first-stage delay detector DL1 is shorter. This reduces the difference between the output load of the last-stage delay detector DLn and the output loads of the first-stage delay detector DL1, the second-stage delay detector DL2, and the third-stage delay detector DL3. Thus by varying the sequence of the delay detectors DL, and the arrangement of the delay units D1, . . . , Dn and the latch units L1, . . . , Ln in the delay detectors DL, the difference in the interconnection lengths (distances) of the signal wires between the delay detectors DL can be reduced, and the difference in the output loads of the delay units D1, . . . , Dn of each stage can be reduced.

Even when the arrangement of the delay units D1, . . . , Dn and the latch units L1, . . . , Ln in the delay detectors DL1, . . . , DLn is reversed, each of the delay units D1, ..., Dn in the delay circuit 811 and each corresponding latch unit L1, ..., Ln in the corresponding latch circuit 81221 are arranged adjacently. Therefore, there is no great change in the interconnection lengths (distances) of the signal wires between the delay units D1, ..., Dn and the latch units L1, ..., Ln in the delay detectors DL1, ..., DLn, and the interconnection lengths in the delay detectors DL1, ..., DLn are almost equal. Consequently the output loads of the delay units D1, ..., Dn in the delay detectors DL1, ..., DLn do not change.

As described above, the delay detectors DL1, ..., DLn in the ADC 8_2 are arranged without regard for the sequence of the number of stages of delay units D1, ..., Dn, and the arrangement of the delay units D1, ..., Dn and the latch units L1, ..., Ln in the delay detectors DL1, ..., DLn is reversed. This can reduce the difference in the interconnection lengths (distances) of the signal wires between the delay detectors DL. Consequently, the difference in output loads of the delay units D1, ..., Dn of each stage can be reduced. Thus, during the operation of the ADC 8_2, it is possible to reduce difference in the output delay amounts of the output signals from the delay units D1, ..., Dn held by the latch units L1, ..., Ln. This output delay amount expresses the output delay amount of positional information in each stage relating to the input pulse signal φPL which is circulating in the delay circuit 811 with a delay time corresponding the voltage difference between the input signal and the reference voltage wire (GND in this example). The latch units L1, ..., Ln in the ADC 8_2 can thus hold the correct positional information output from the delay units D1, ..., Dn.

Figure 5:
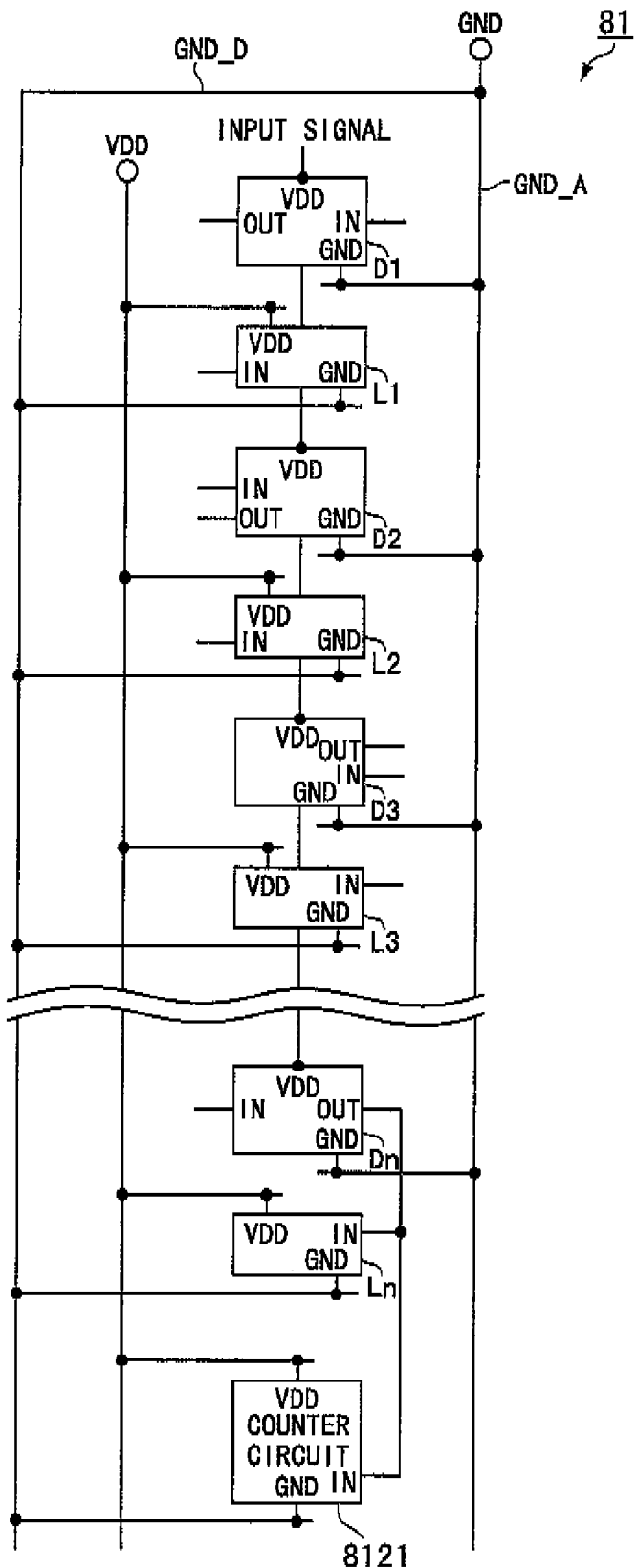
FIG. 5 is a block diagram illustrating an example of a voltage wire connection in the ADC 81 included in the photoelectric conversion device in accordance with the first preferred embodiment of the present invention.

Subsequently, another example of a connection between the power voltage wire (VDD) and the reference voltage (GND) in the ADC 81 of the photoelectric conversion device 1 in accordance with the first preferred embodiment of the present invention will be described. FIG. 5 is a block diagram illustrating an example of a voltage wire connection in the ADC 81 included in the photoelectric conversion device 1 in accordance with the first preferred embodiment of the present invention. FIG. 5 shows only constituent components in the ADC 81, in addition to the power voltage wires (VDD) connected to the power terminals of the constituent components in the ADC 81 and the reference voltage wires (GND) connected to the GND terminals. FIG. 5 does not show other A/D converters (ADC 82 to ADC 84), other constituent components in the photoelectric conversion device 1 and the ADC 8, or their connections.

In the photoelectric conversion device 1 illustrated in FIG. 5, the power voltage wires (VDD) and the reference voltage wires (GND) extend in the column direction of the pixel array 3. Each reference voltage wire (GND) branches near its starting point into reference voltage wire GND_A and reference voltage wire GND_D. The reference voltage wire GND_A is used for the delay circuit 811 (delay unit), the output of which is greatly affected by the voltage fluctuation of the input signal of the ADC 8 and the reference voltage (GND in this example). The reference voltage wire GND_D is used for the latch unit and counter circuit 8121, the output of which is little affected by the voltage fluctuation of the input signal of the ADC 8 and the reference voltage (GND in this example). The power voltage wire (VDD), reference voltage wire GND_A, and reference voltage wire GND_D extending in the column direction of the pixel array 3 branch for use by constituent components of all stages in the ADC 8, and then extend in the row direction of the pixel array 3. The power voltage wire (VDD), reference voltage wire GND_A, and the reference voltage wire GND_D extending in the row direction of the pixel array 3 are connected to the power terminal and GND terminal of the constituent components in the ADC 8. While not illustrated in FIG. 5, the power voltage wire (VDD), reference voltage wire GND_A, and the reference voltage wire GND_D branching for use by constituent components of all stages in the ADC 8 are connected to a plurality of constituent components in the same stage in each ADC 8, as in FIG. 3.

The reference voltage wire (GND) branching from the reference voltage wire GND_A for use by constituent components of all stages in the ADC 8 is connected only to the delay units D1, ..., Dn in the ADC 8, and is connected to the GND terminal of the delay units D1, ..., Dn.

The reference voltage wire (GND) branching from the reference voltage wire GND_D for use by constituent components of all stages in the ADC 8 is connected only to the latch units L1, ..., Ln and counter circuit 8121 in the ADC 8, and is connected to the GND terminal of the latch units L1, ..., Ln and counter circuit 8121. The reference voltage wire GND_D that has branched for use by the counter circuit 8121 is connected to the encoder 81222 and the adder 8123, which are not illustrated in FIG. 5. In the present invention, there are no stipulations regarding the method of connecting the reference voltage wire GND_D to the encoder 81222 and the adder 8123.

More specifically, as illustrated in FIG. 5, in the ADC 8, when the delay detectors DL1, ..., DLn are arranged in sequence from top to bottom in the column direction of the pixel array 3, and with the counter circuit 8121 provided after the delay detector DLn also in the column direction of the pixel array 3, the reference voltage wire (GND) extending in the column direction of the pixel array 3 branches into reference voltage wire GND_A and reference voltage wire GND_D, which extend in the column direction of the pixel array 3. The reference voltage wire GND_A branches in the sequence of, from the top, first-stage delay unit D1, second-stage delay unit D2, third-stage delay unit D3, ..., last-stage delay unit Dn. The reference voltage wire GND_D branches in the sequence of, from the top, first-stage latch unit L1, second-stage latch unit L2, third-stage latch unit L3, ..., last-stage latch unit Ln, and counter circuit 8121. The power voltage wire (VDD) branches in the sequence of, from the top, third-stage latch unit L1, second-stage latch unit L2, third-stage latch unit L3, ..., last-stage latch unit Ln, and counter circuit 8121, The power voltage wire (VDD), the reference voltage wire GND_A, and the reference voltage wire GND_D extend in the row direction of the pixel array 3, and are connected to their corresponding constituent components in the ADC 8.

While not illustrated in FIG. 5, the power voltage wires (VDD) and the reference voltage wires (GND_A and GND_D) branching to constituent components of respective stages in the ADC 8 are connected to a plurality of constituent components in the same stage in each ADC 8, as in FIG. 3. The reference voltage wire (GND) branching from the reference voltage wire GND_A for use by constituent components of all stages in the ADC 8 is connected only to the delay unit in the ADC 8, and is connected to the GND terminal of that delay unit. For example, as illustrated in FIG. 3, when the ADCs 8 are arranged from left to right in a sequence of ADC 81, ADC 82, ADC 83, and ADC 84, the power voltage wires (VDD) and the reference voltage wires (GND_A and GND_D) extending in the row direction of the pixel array 3 are connected from the left in a sequence of constituent components in the ADC 81, constituent components in the ADC 82, constituent components in the ADC 83, and constituent components in the ADC 84.

When a reference voltage wire connected to a plurality of ADCs 8 is branched near its starting point into reference voltage wire GND_A and reference voltage wire GND_D in this manner, it becomes possible to connect the reference voltage wires separately. The reference voltage wire GND_A is used for a circuit whose output is greatly affected by the voltage fluctuation of the reference voltage (GND in this example) of the ADC 8. The reference voltage wire GND_D is used for a circuit whose output is little affected by the voltage fluctuation of the reference voltage (GND in this example). Therefore, for example, noise generated while the encoder 812 of the ADC 8 is operating can be prevented from affecting the delay circuit 811 (delay unit) of the ADC 8. In a conventional A/D converter, since the delay circuit 811 and the encoder 812 are connected in common to a reference voltage, the A/D converter is affected by noise of the self ADC that accompanies fluctuation in the reference voltage wire generated when the encoder 812 operates. In contrast, the A/D convertor in accordance with the first preferred embodiment of the present invention is not affected by noise of the encoder 812 in the self ADC 8 due to the branching of the reference voltage wire.

While FIG. 5 described a modification to the connection of the voltage wires in an example layout in the ADC 81 illustrated in FIG. 3, a similar modification to the voltage wire connection can be made in the ADC 8_2 illustrated in FIG. 4 and in other A/D converter layout examples.

As described above, in accordance with the first preferred embodiment of the present invention, the delay units D1, . . . , Dn in the delay circuit 811 and the latch units L1, . . . , Ln in the corresponding latch circuit 81221 are paired and arranged adjacently to form delay detectors DL1, . . . , DLn that are arranged in an A/D convertor. This makes it possible to shorten the interconnection length (distance) of the signal wire between the delay detectors DL. Furthermore, since the interconnection lengths (distances) of the signal wires between the delay detectors DL can be made almost equal, the output loads of the delay units D1, . . . , Dn in the delay circuits 811 can be made almost equal. When the delay detectors DL1, . . . , DLn are arranged without regard for the sequence of the number of stages of delay units D1, . . . , Dn, it becomes possible to reduce the difference in the interconnection lengths (distances) of the signal wires between the delay detectors DL. Consequently, the difference in output loads of the delay units D1, . . . , Dn in the delay circuits 811 can be reduced. Correct positional information can thus be acquired from each of the delay unit D1, . . . , Dn. Therefore, when subjecting a signal at a voltage in accordance with the amount of incident light to the pixel 2 to an analog-digital conversion in the A/D converter containing a delay circuit, the photoelectric conversion device can output a correct digital value and acquire correct image data.

In accordance with the first preferred embodiment of the present invention, the reference voltage wire is branches into a reference voltage wire for a circuit whose output is greatly affected by the voltage fluctuation of the reference voltage (GND in this example) of the ADC 8, and a reference voltage wire for a circuit whose output is little affected by the voltage fluctuation of the reference voltage (GND in this example). The branched reference voltage wires can then be connected separately to the constituent components. For example, the reference voltage wire can be branched into a reference voltage wire for the delay circuit 811 and a reference voltage wire for the encoder 812. In the delay circuit 811, the voltage fluctuation of the reference voltage wire (GND in this example) of the ADC 8 greatly affects the output. In the encoder 812, the voltage fluctuation of the reference voltage wire (GND in this example) of the ADC 8 has little effect on the output. The reference voltage wire for the delay circuit 811 is connected only to the delay unit in the ADC 8. The reference voltage wire for the encoder 812 is connected only to the encoder 812. This ensures that noise generated by the encoder 812 in the A/D converter does not greatly affect the delay circuit 811, whose output is greatly affected by fluctuation of the reference voltage (GND in this example). When subjecting a signal at a voltage in accordance with the amount of incident light to the pixel 2 to an analog-digital conversion in the A/D converter containing a delay circuit, noise generated from the encoder circuit does not affect the operation of the delay circuit. Therefore, the photoelectric conversion device can output a correct digital value with little noise, and acquire correct image data.

In the first preferred embodiment of the present invention, in FIG. 2, a voltage wire of the reference voltage (GND in this example) supplied to the delay units in the delay circuit 811 is a different voltage wire from that of the GND (grounding) potential supplied to each of the constituent components in the encoder 812, and these voltage wires are not connected. As described above, the voltage wire of the reference voltage and the voltage wire of the GND potential have the same potential. Therefore, the voltage wire of the reference voltage and the voltage wire of the GND potential are each connected inside or outside the photoelectric conversion device 1. Based on similar considerations to those in the example of the voltage wire connection in the A/D converter shown in FIG. 5, the voltage wire of the reference voltage and the voltage wire of the GND potential are preferably connected near the source of the potential, e.g. a reference voltage generating unit that is not illustrated in the figures. This makes it possible to connect all the delay units D1, . . . , Dn in the delay circuit 811 to the source of the potential, e.g. a reference voltage generating unit (GND in this example), and then connect the voltage wires of the GND potentials such as the counter circuit 8121 in the encoder 812 and the encoder circuit 8122. Thus the voltage wire of the reference voltage and the voltage wire of the GND potential can be set at the same potential. Therefore, as described using FIG. 5, the operation of the delay circuit 811 of the A/D converter is not affected by the noise from the encoder 812, and the photoelectric conversion device 1 can output a yet more correct digital value.

Second Preferred Embodiment

Figure 6:
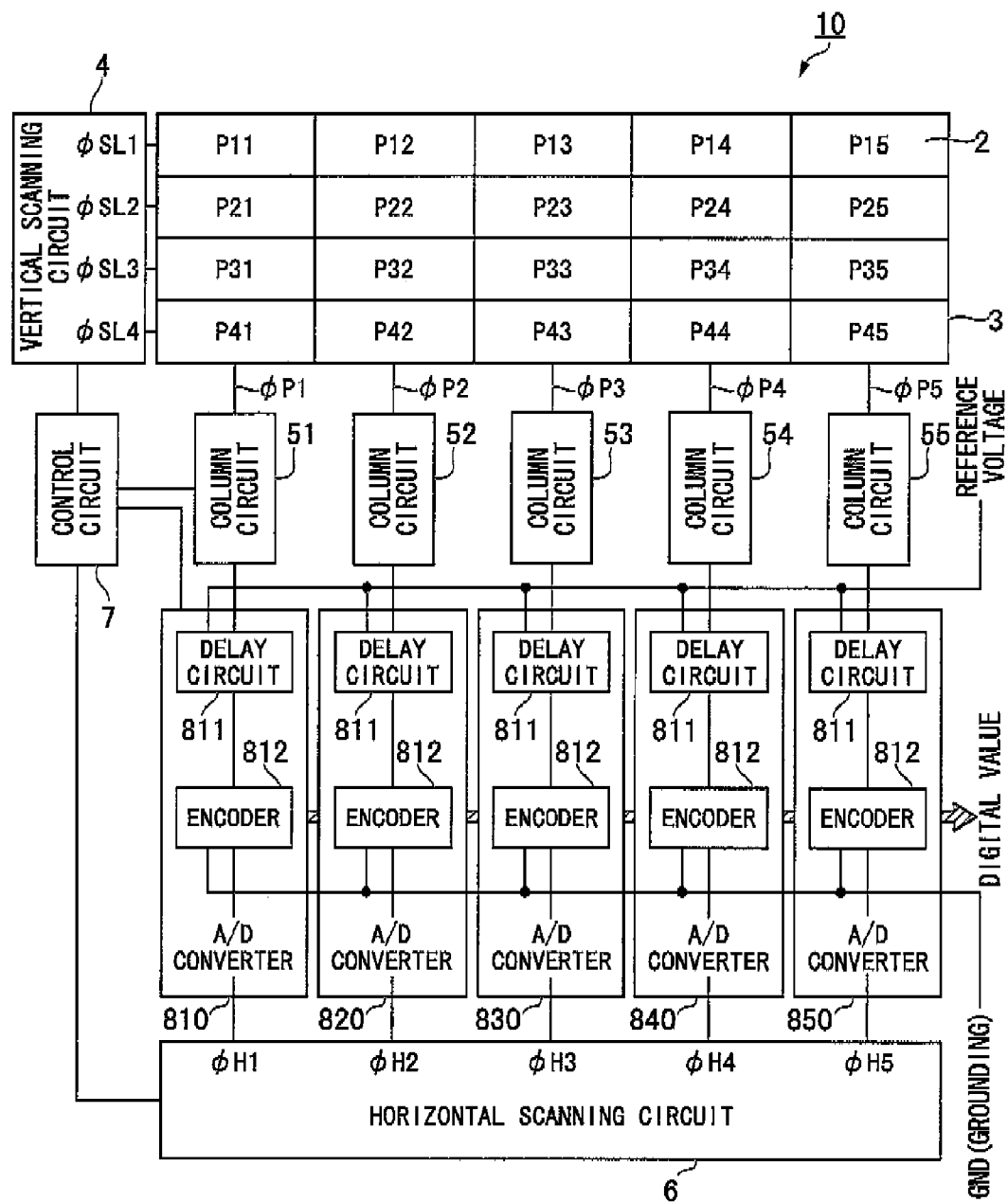
FIG. 6 is a block diagram of a schematic configuration of a photoelectric conversion device in accordance with a second preferred embodiment of the present invention.

A second preferred embodiment of the present invention will be described using the figures. FIG. 6 is a block diagram of a schematic configuration of a photoelectric conversion device 10 in accordance with a second preferred embodiment of the present invention. The photoelectric conversion device 10 includes pixels P11, . . . , P45, a vertical scanning circuit 4, column circuits 51, . . . , 55, a horizontal scanning circuit 6, a control circuit 7, and A/D convertors 810, . . . , 850. The A/D convertors 810, . . . , 850 are hereinafter referred to as ADCs 810, . . . , 850. 'ADC 80' denotes one of the ADCs 810, . . . , 850. ADC 80 has the same configuration as the ADC 81 illustrated in FIG. 2.

In the configuration of the photoelectric conversion device 10 in accordance with the second preferred embodiment of the present invention illustrated in FIG. 6, the ADC 8 is substituted with the ADC 80. The only point of difference in FIG. 6 is that the voltage wire for supplying a reference voltage to the delay circuit 811 and the voltage wire for supplying a GND (grounding) potential to the encoder 812 are separate. The constituent components are otherwise the same as those in the photoelectric conversion device 1 of FIG. 1. Therefore, the operations of the photoelectric conversion device 10 and the ADC 80 in accordance with the second preferred embodiment of the present invention are the same as the operations of the photoelectric conversion device 1 and the ADC 8 illustrated in FIG. 1, and will not be repetitiously described.

Figure 7:
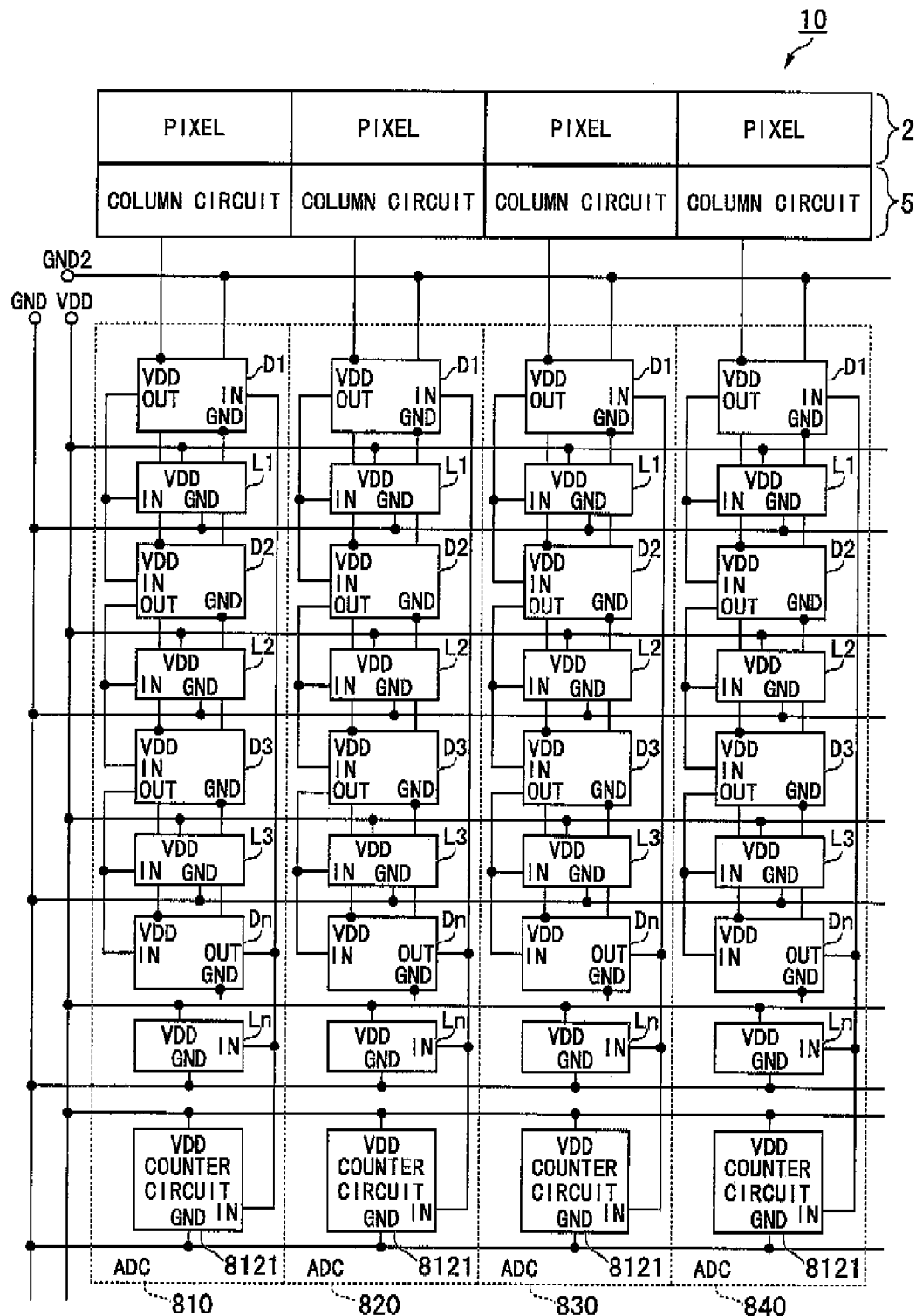
FIG. 7 is a block diagram illustrating an example of a schematic layout of the constituent components in an A/D converter included in the photoelectric conversion device in accordance with the second preferred embodiment of the present invention, and an example of the connection of the voltage wires therein.

Subsequently, the layout of the constituent components in the A/D convertor of the photoelectric conversion device 10 in accordance with the second preferred embodiment of the present invention, and the connections between the power voltage wires, the reference voltage wires, and the GND potential voltage wires will be described. FIG. 7 is a block diagram illustrating an example of a schematic layout of the constituent components in an A/D converter included in the photoelectric conversion device 10 in accordance with the second preferred embodiment of the present invention, and an example of the connection of the voltage wires therein. Since the layout of the constituent components in the ADC 80 illustrated in FIG. 7 is the same as that of the ADC 8 shown in FIG. 3, it will not be repetitiously described.

In the photoelectric conversion device 10 illustrated in FIG. 7, the power voltage wire (VDD) and the GND potential voltage wire (GND) extend in the column direction of the pixel array 3. A reference voltage wire (GND2) extends in the row direction of the pixel array 3. In FIG. 7, the GND potential voltage wire (GND) supplies a GND (grounding) potential to the encoder 812 (the latch unit and counter circuit 8121 and the like) whose output is little affected by voltage fluctuation of the reference voltage wire (GND in this example) in the ADC 80, and is hereinafter referred to as a 'GND voltage wire'. The voltage wire of the reference voltage (GND2) supplies a potential of the reference voltage (GND in this example) to the delay circuit 811 (delay units) whose output is greatly affected by voltage fluctuation of the reference voltage wire (GND in this example) at the ADC 80, and is hereinafter referred to as a 'GND2 voltage wire'.

The power voltage wire and the GND voltage wire that extend in the column direction of the pixel array 3 branch for use in each stage of the constituent components of the ADC 80, and extend in the row direction of the pixel array 3. Having branched for use in each stage of the constituent components of the ADC 80, the power voltage wire and the GND voltage wire are connected to the power terminal or the GND terminal of the constituent components in the ADC 80, and are connected to a plurality of constituent components in the same stage number in the ADC 80.

The GND2 voltage wire extending in the row direction of the pixel array 3 branches to each ADC 80 and then extends in the column direction of the pixel array 3. Having branched to the ADC 80, the GND2 voltage wire is connected as a reference potential to the reference voltage terminal (GND terminal) of each of the delay units D1, ..., Dn in that ADC 80; it is connected only to the delay circuit 811 in the corresponding ADC 80.

More specifically, consider the configuration illustrated in FIG. 7. In the photoelectric conversion device 10, the arrangement sequence is, from left to right, the ADC 810, the ADC 820, the ADC 830, and the ADC 840. In each ADC 80, the arrangement sequence from top to bottom is the delay detector DL1, the delay detector DL2, the delay detector DL3, and the delay detector DLn. That is, the delay unit in the delay circuit 811 and the latch unit in the latch circuit 8122 are arranged alternately, with the counter circuit 8121 arranged after the latch unit Ln in the delay detector DLn of the last stage.

Here, as in FIG. 3, the reference voltage wire extending in the column direction of the pixel array 3 is branched in the sequence of, from the top, use for the first-stage latch unit L1, the second-stage latch unit L2, the third-stage latch unit L3, ..., the last-stage latch unit Ln, and the counter circuit 8121. The GND voltage wire extending in the column direction of the pixel array 3 is branched in the sequence of, from the top, use for the first-stage latch unit L1, the second-stage latch unit L2, the third-stage latch unit L3, ..., the last-stage latch unit Ln, and the counter circuit 8121. Each branched reference voltage wire and GND voltage wire extends in the row direction of the pixel array 3. Each reference voltage wire and GND voltage wire extending in the row direction of the pixel array 3 is connected in the sequence of, from the left, constituent components in the ADC 810, constituent components in the ADC 820, constituent components in the ADC 830, and constituent components in the ADC 840.

After being branched to the counter circuit 8121, the power voltage wire and the GND voltage wire are connected to the encoder 81222 and the adder 8123, which are not illustrated in FIG. 7. In the present invention, there are no stipulations regarding the method of connecting the encoder 81222 and the adder 8123 to the power voltage wire and the GND voltage wire.

The GND2 voltage wire extending in the row direction of the pixel array 3 branched from the left in the sequence of use for the ADC 810, the ADC 820, the ADC 830, and the ADC 840. The GND2 voltage wire branched to each ADC 80 extends in the column direction of the pixel array 3. Each GND2 voltage wire for each ADC 80 extending in the column direction of the pixel array 3 is connected to the delay circuit 811 in its corresponding ADC 80. For example, the GND2 voltage wire for the ADC 810 is connected in the sequence of from the branch point of the GND2 voltage wire (i.e. from the top of FIG. 7), first-stage delay unit D1, second-stage delay unit D2, third-stage delay unit D3, ..., and last-stage delay unit Dn.

By arranging the GND2 voltage wires in this manner, the GND2 voltage wire of each ADC 80 can be separated at the branch points in the row direction of the pixel array 3. Therefore, the potentials of the GND2 voltage wires extending in the row direction of the pixel array 3 can be kept almost constant. The GND2 voltage wires branching to each ADC 80 are connected only to the delay circuit 811 of the corresponding ADC 80. Each ADC 80 can thus be separated. The delay circuit 811 whose output is greatly affected by voltage fluctuation of the reference voltage wire (GND in this example) in each ADC 80 GM be separated from the encoder 812 whose output is little affected by voltage fluctuation of the reference voltage wire (GND in this example) in each ADC 80. Therefore, for example, noise from the encoder 812 generated when the ADC 810 is operating, cannot affect the operation of the delay circuits 811 of the ADCs 820, ..., 840. The operation of the delay circuit 811 of the ADC 810 is not affected by noise from the encoder 812 generated when the ADCs 820, ..., 840 are operating. Therefore, the delay circuit 811 in each ADC 80 is not affected by noise from the encoder 812 generated when each other ADC 80 is operating. Noise generated when the encoder 812 of the each other ADC 80 is operating does not affect the operation of the delay circuit 811 of the other ADC 80.

FIG. 7 described a modification to the connection of the voltage wires in the example layout in the ADC 81 illustrated in FIG. 3. The connection of the voltage wires can also be modified in the example layout in the ADC 8_2 illustrated in FIG. 4 and other A/D converters.

As described above, in accordance with the second preferred embodiment of the present invention, it is possible to separate the delay circuit 811 whose output is greatly affected by voltage fluctuation of the reference voltage (GND in this example) in the ADC 80 from the encoder 812 whose output is little affected by voltage fluctuation of the reference voltage (GND in this example). The voltage wire of the circuit whose output is greatly affected by voltage fluctuation of the reference voltage (GND in this example) can be branched to each ADC 80. The voltage wire branched for use by each ADC 80 can acceptably be connected only to the circuit whose output is greatly affected by voltage fluctuation of the reference voltage (GND in this example) in the corresponding ADC 80. Therefore, it can be separated from noise from the circuit whose output is greatly affected by fluctuation in the reference voltage wire (GND in this example) generated when the ADC 80 is operating. For example, the reference voltage wire (GND in this example) of the delay circuit 811 in the ADC 810 is supplied only to the delay units in the self delay circuit 811, and is kept separate from the reference voltage wire (GND in this example) of the delay circuit 811 in the other A/D converters (the ADCs 820, ..., 850). Therefore, the ADC 810 is not affected by noise generated when the other A/D converters (ADCs 820, ..., 850) are operating.

Therefore, in accordance with the second preferred embodiment of the present invention, in a photoelectric conversion device including a plurality of A/D converters, noise generated by the operation of the A/D converters does not affect the other A/D converters or the internal circuits of the self A/D converter. It is therefore possible to acquire correct positional information output from the delay units in the delay circuit 811. Consequently, the image data output by the photoelectric conversion device does not deteriorate, and image data with little noise can be acquired.

FIG. 6 and FIG. 7 are block diagrams of states where the reference voltage wire (GND2 voltage wire) that supplies the reference voltage to the delay circuit 811 in the ADC 80 is a different voltage wire from the reference voltage wire of the GND potential (GND voltage wire) that supplies GND (grounding) potential to the encoder 812. When the GND2 voltage wire and the GND voltage wire have the same potential, they must be connected outside and inside the photoelectric conversion device 10. In that case, as in FIG. 5, the GND2 voltage wire and the GND voltage wire are preferably connected near the source of the potential, i.e. a unit (not illustrated in the figures) that generates the reference voltage (GND in this example). Consequently, all the delay units in the delay circuit 811 can be connected to the unit that generates the reference voltage (GND in this example). Thereafter, the counter circuit 8121 and the latch and encoder circuit 8122 in the encoder 812 can be connected to the GND voltage wire. This enables the GND2 voltage wire and the GND voltage wire to be set at the same potential. As described in FIG. 5, the delay circuit 811 in the ADC 80 is consequently less likely to be affected by noise generated when the encoder 812 is operating. Therefore, the photoelectric conversion device 10 can output a more correct digital value.

As described above, in accordance with the preferred embodiments of the present invention, the delay units D1, ..., Dn in the delay circuit 811 and the latch units L1, ..., Ln in the corresponding latch circuit 81221 are paired and arranged adjacently as delay detectors DL1, ..., DLn in the A/D converter. The output loads of the delay units D1, ..., Dn in the delay circuit 811 can thereby be made almost equal. The sequence of arranging the delay detectors DL1, ..., DLn is modified. This reduces the output loads of the delay units D1, ..., Dn in the delay circuit 811, whereby correct positional information can be acquired from them. A photoelectric conversion device that subjects a signal at a voltage in accordance with the amount of light incident to the pixel 2 in the A/D converter containing the delay unit to an analog-digital conversion can thus output a correct digital value. Correct image data can thereby be acquired.

In accordance with the preferred embodiments of the present invention, it is possible to connect the voltage wires such that they are separate or branched to a circuit whose output is greatly affected by the voltage fluctuation of the reference voltage (GND in this example) in the A/D converter and a circuit whose output is little affected by the voltage fluctuation of the reference voltage (GND in this example). Therefore, noise from the circuit whose output is little affected by the voltage fluctuation of the reference voltage (GND in this example) can be prevented from affecting the circuit whose output is greatly affected by the voltage fluctuation of the reference voltage (GND in this example). This can prevent noise generated by the encoder circuit from affecting the delay circuit operating when subjecting the signal whose voltage is in accordance with the amount of light incident to the pixel 2 in the A/D converter containing the delay unit to an analog-digital conversion. Therefore, the photoelectric conversion device can output a correct digital value with little noise, and thereby acquire correct image data.

The present invention imposes no stipulations on the method of detecting the number of stages of delay units D1, ..., Dn in the delay circuit 811 passed by the input pulse signal ϕPL in the encoder 812 and the number of its circulations around the delay circuit 811, or on the method of calculating the most final digital value which is the result acquired when the ADC 81 or the ADC 810 makes an analog-digital conversion from the detected number of passed stages of delay units D1, ..., Dn or the number of circulations.

While in the preferred embodiments described above, the ADC 81, ..., the ADC 85 and ADC 810, ..., the ADC 850 are arranged in accordance with the amount of light incident to the pixel array 3 arranged two-dimensionally in four rows and five columns, the present invention can be applied in an A/D converter that performs an analog-digital conversion of the output of a linear sensor including a plurality of pixels configured in one column.

While in the preferred embodiments described above, the column circuit 5 is arranged between the pixel array 3 and the ADC 8 or the ADC 80, the column circuit 5 need not be provided. If a pixel signal corresponding to the difference between a pixel reset signal of the pixel output signal and the optical signal is input to the ADC 8 or the ADC 80, then the analog-digital conversion can be performed in the same manner.

Figure 8:
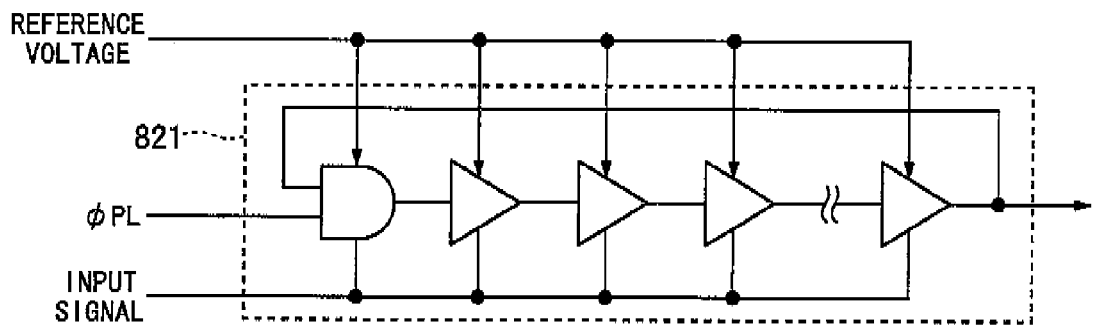
FIG. 8 is a block diagram illustrating another example of a configuration of the delay circuit in accordance with the second preferred embodiment of the present invention.
Figure 9:
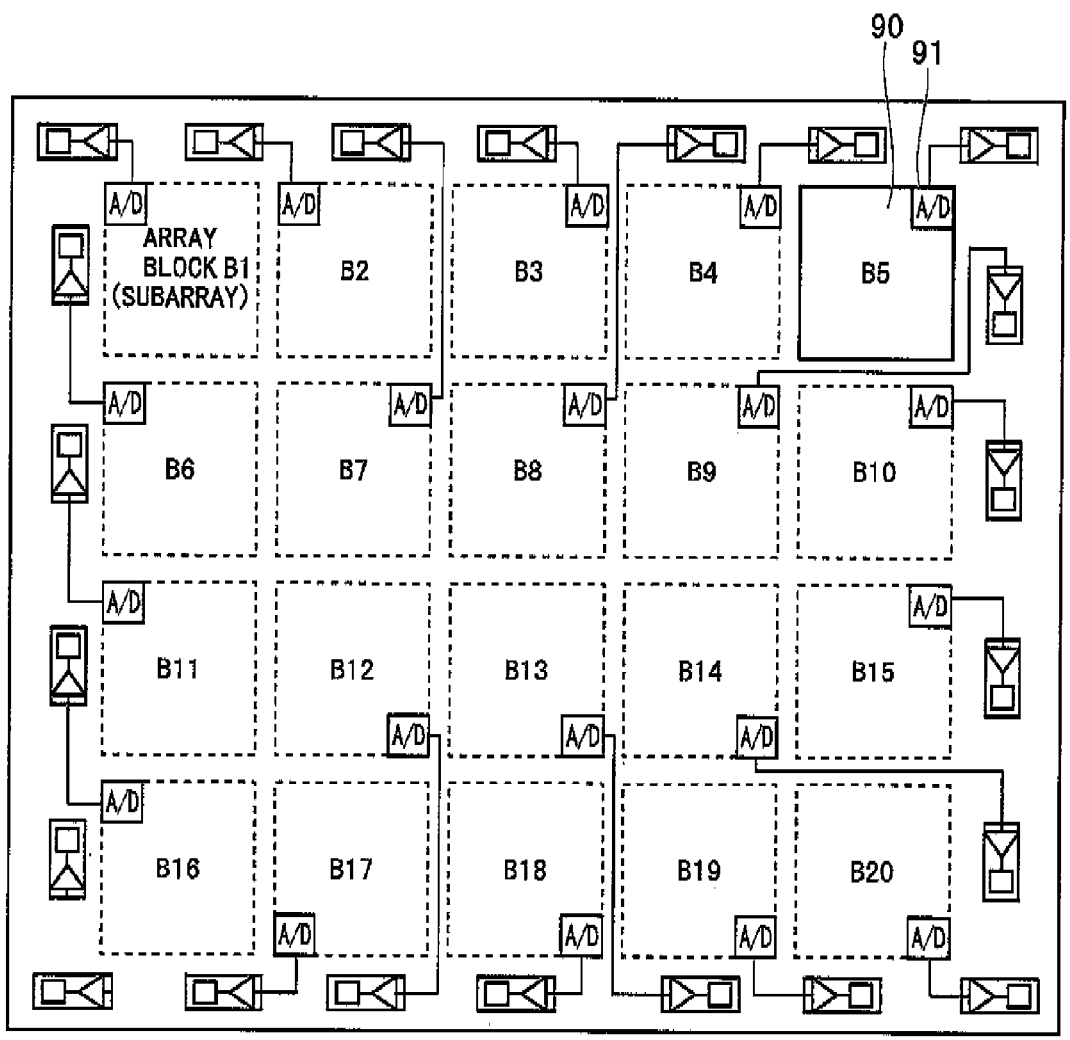
FIG. 9 is a block diagram illustrating a schematic configuration of a solid-state image-pickup device in accordance with the related art.
Figure 10:
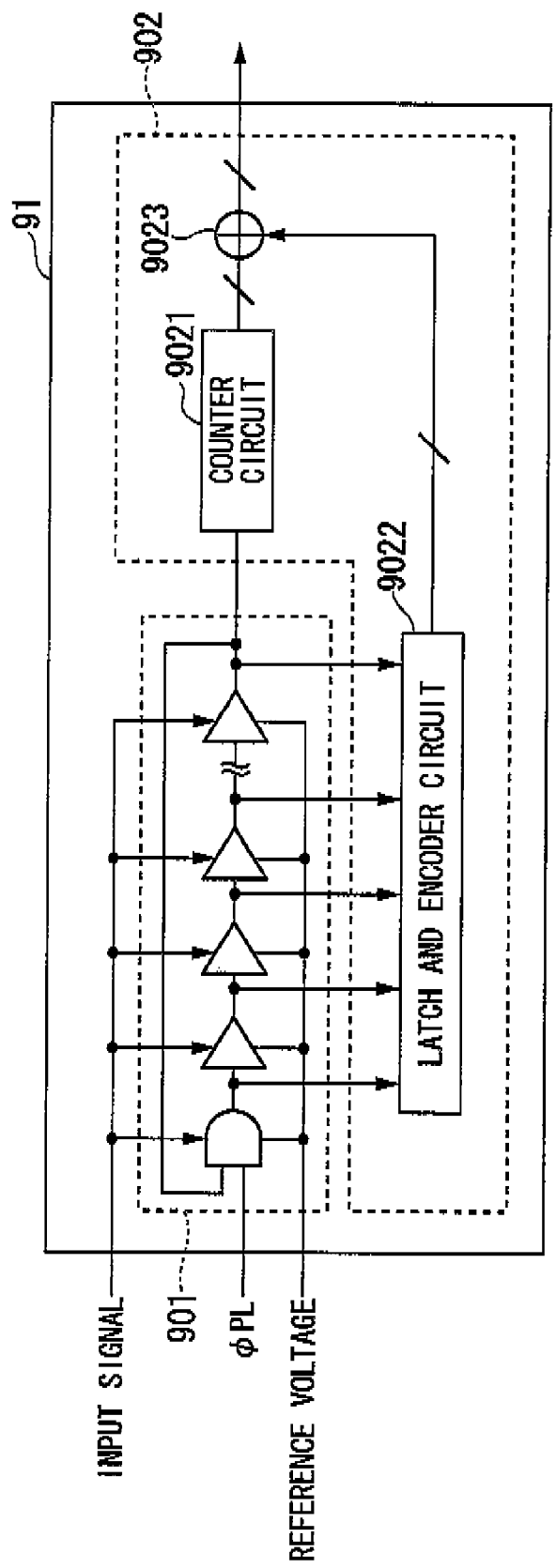
FIG. 10 is a block diagram illustrating an example of a circuit configuration of an A/D converter 91 included in each of the array blocks (subarrays) of FIG. 9.
Figure 11:
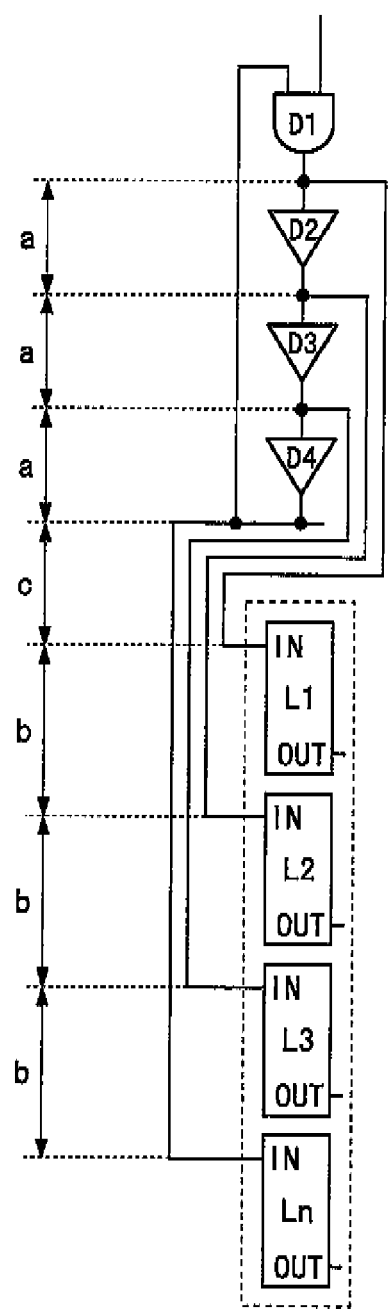
FIG. 11 is a block diagram schematically illustrating an example of a layout of constituent components in an A/D converter included in a solid-state image-pickup device in accordance with the related art.

In the above description, the delay units D1, ..., Dn in the delay circuit 811 treat the power side as the input signal, i.e. the pixel signal that becomes the object of analog-digital conversion, and the ground side as a reference voltage. FIG. 8 is a block diagram illustrating another example of a configuration of the delay circuit 821 in accordance with the second preferred embodiment of the present invention. As shown by the delay circuit 821 of FIG. 8, the power side can be treated as the reference voltage and the ground side as the input side.

While not illustrated in the figures, if there are two types of input signals, then the configuration may be one where the power side is treated as a first input signal and the ground side is treated as a second input signal. Or, on the contrary, the configuration may be one where the power side is treated as a second input signal and the ground side is treated as a first input signal.

In the above description, in the delay circuit 811 and the delay circuit 821 in accordance with the preferred embodiments of the present invention, the first-stage delay unit D1 contains a negative AND circuit (a NAND gate) and an inverter circuit (an INV gate), while the other delay units D2, ..., Dn contain two inverter circuits (INV gates). In the present invention, there are no stipulations on the configuration of the delay circuit, which can have any configuration that enables an input pulse to circulate with a delay time that is in accordance with the difference between the voltage level of an input signal and a reference voltage level, or between the voltage levels of two input signals.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. A photoelectric conversion device comprising:
    a pixel array that includes a plurality of pixels arranged two-dimensionally, each of the plurality of pixels having a photoelectric conversion element, the pixel array outputting a pixel signal in accordance with an incident light amount to the photoelectric conversion element; and
    a plurality of A/D converters each of which includes a pulse delay circuit and an encoder, the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, and
    wherein the encoder comprising:
        a latch circuit that includes a plurality of latch units each of which corresponds to the plurality of delay units, each of the plurality of latch units storing delay information, the delay information being output when the pulse signal passes through each of the plurality of delay units;
        an encoder unit that outputs the digital value based on the delay information; and
        a counter unit that counts the number of circulations of the pulse signal passing through the plurality of delay units within a predetermined period of time, the counter unit outputting the digital value based on the number of circulations,
    wherein each of the plurality of delay units and each of the plurality of latch units corresponding to each of the plurality of delay units are arranged adjacently in a first direction of the pixel array to configure each of a plurality of delay detectors,
    wherein the plurality of delay detectors are arranged adjacently in the first direction, and
    wherein a reference voltage wire that supplies the reference voltage to each of the plurality of A/D converters is branched to be a plurality of branched reference voltage wires, each of the plurality of branched reference voltage wires corresponds to each constituent component in the plurality of A/D converters, and each of the plurality of branched reference voltage wires is connected to a corresponding constituent component in the plurality of A/D converters.

2. The photoelectric conversion device according to claim 1, wherein a last-stage delay detector including a last-stage delay unit is arranged in the first direction so as to be arranged adjacently to the counter unit.

3. The photoelectric conversion device according to claim 1, wherein
    the reference voltage wire is arranged to extend in the first direction,
    a plurality of branch points are arranged in the first direction, each of the plurality of branched reference voltage wires is separated from the reference voltage wire at each of the plurality of branch points,
    each of the plurality of branched reference voltage wires is arranged to extend in a second direction of the pixel array that is different from the first direction,
    the plurality of A/D converters are arranged in the second direction,
    a plurality of first connection points and a second connection point are arranged in the first direction, each of the plurality of delay detectors is connected to each of the plurality of branched reference voltage wires at each of the plurality of first connection points, and the counter unit is connected to each of the plurality of branched reference voltage wires at the second connection point.

4. The photoelectric conversion device according to claim 1, wherein
    the first direction is a column direction of the pixel array,
    a second direction is a row direction of the pixel array, and
    the number of the plurality of A/D converters is based on a column number of the pixel array.

5. A photoelectric conversion device comprising:
    a pixel array that includes a plurality of pixels arranged two-dimensionally, each of the plurality of pixels having a photoelectric conversion element, the pixel array outputting a pixel signal in accordance with an incident light amount to the photoelectric conversion element: and
    a plurality of A/D converters each of which includes a pulse delay circuit and an encoder, the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, and wherein the encoder comprising:
- a latch circuit that includes a plurality of latch units each of which corresponds to the plurality of delay units, each of the plurality of latch units storing delay information, the delay information being output when the pulse signal passes through each of the plurality of delay units;
- an encoder unit that outputs the digital value based on the delay information; and
- a counter unit that counts the number of circulations of the pulse signal passing through the plurality of delay units within a predetermined period of time, the counter unit outputting the digital value based on the number of circulations, wherein each of the plurality of delay units and each of the plurality of latch units corresponding to each of the plurality of delay units are arranged adjacently in a first direction of the pixel array to configure each of a plurality of delay detectors, wherein the plurality of delay detectors are arranged adjacently in the first direction, and wherein a reference voltage wire that supplies the reference voltage to each of the plurality of A/D converters is branched to a first branched reference voltage wire and a second branched reference voltage wire, the first branched reference voltage wire corresponds to the pulse delay circuit, the second branched reference voltage wire corresponds to a corresponding encoder, the first branched reference voltage wire is connected to the corresponding pulse delay circuit, and the second branched reference voltage wire is connected to the corresponding encoder.

6. The photoelectric conversion device according to claim 5, wherein
the first branched reference voltage wire is branched to a plurality of third branched reference voltage wires each of which corresponds to a first constituent component of the pulse delay circuit,
each of the plurality of third branched reference voltage wires is connected to the corresponding first constituent component,
the second branched reference voltage wire is branched to a plurality of fourth branched reference voltage wires each of which corresponds to a second constituent component of the encoder,
each of the plurality of fourth branched reference voltage wires is connected to the corresponding second constituent component,
the first branched reference voltage wire is arranged to extend in the first direction,
the second branched reference voltage wire is arranged to extend in the first direction,
each of the plurality of third branched reference voltage wires is arranged to extend in a second direction of the pixel array that is different from the first direction,
each of the plurality of fourth branched reference voltage wires is arranged to extend in the second direction of the pixel array that is different from the first direction,
the plurality of A/D converters are arranged in the second direction,
a plurality of first connection points and a second connection point are arranged in the first direction, each of the plurality of delay detectors is connected to one of the plurality of third branched reference voltage wires and the plurality of fourth branched reference voltage wires at each of the plurality of first connection points, and the counter unit is connected to each of the plurality of fourth branched reference voltage wires at the second connection point.

7. A photoelectric conversion device comprising:
a pixel array that includes a plurality of pixels arranged two-dimensionally, each of the plurality of pixels having a photoelectric conversion element, the pixel array outputting a pixel signal in accordance with an incident light amount to the photoelectric conversion element; and
a plurality of A/D converters each of which includes a pulse delay circuit and an encoder, the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, and wherein the encoder comprising:
- a latch circuit that includes a plurality of latch units each of which corresponds to the plurality of delay units, each of the plurality of latch units storing delay information, the delay information being outpit when the pulse signal passes through each of the plurality of delay units;
- an encoder unit that outputs the digital value based on the delay information; and
- a counter unit that counts the number of circulations of the pulse signal passing through the plurality of delay units within a predetermined period of time, the counter unit outputting the digital value based on the number of circulations, wherein each of the plurality of delay units and each of the plurality of latch units corresponding to each of the plurality of delay units are arranged adjacently in a first direction of the pixel array to configure each of a plurality of delay detectors., wherein the plurality of delay detectors are arranged adjacently in the first direction, and wherein a reference voltage wire that supplies the reference voltage to each of the plurality of A/D converters is branched to a first branched reference voltage wire and a second branched reference voltage wire, the first branched reference voltage wire corresponds to the pulse delay circuit, the second branched reference voltage wire corresponds to the encoder, the first branched reference voltage wire is branched to a plurality of third branched reference voltage wires each of which corresponds to the pulse delay circuit, the second branched reference voltage wire is branched to a plurality of fourth branched reference voltage wires, each of which corresponds to a constituent component in the encoder, each of the third branched reference voltage wires is connected only to the corresponding pulse delay circuit, and each of the fourth branched reference voltage wire is connected to the corresponding constituent component.

8. The photoelectric conversion device according to claim 7, wherein the first branched reference voltage wire is arranged to extend in a second direction of the pixel array that is different from the first direction, the second branched reference voltage wire is arranged to extend in the first direction, a first branch point is arranged in the second direction, each of the plurality of third branched reference voltage wires is separated from the first branched reference voltage wire at the first branch point, a second branch point is arranged in the first direction, each of the plurality of fourth branched reference voltage wires is separated from the second branched reference voltage wire at the second branch point, the third branched reference voltage wires are arranged to extend in the first direction, the fourth branched reference voltage wires are arranged to extend in the second direction, the plurality of A/D converters are arranged in the second direction, a plurality of first connection points and a second connection point are arranged in the first direction, each of the plurality of delay detectors is connected to one of the plurality of third branched reference voltage wires and the plurality of fourth branched reference voltage wires at each of the plurality of first connection points, and the counter unit is connected to each of the plurality of fourth branched reference voltage wires at the second connection point.

9. A photoelectric conversion device comprising:
a plurality of A/D converters each of which includes a pulse delay circuit and an encoder, the pulse delay circuit including a plurality of delay units, each of the plurality of delay units delaying a pulse signal with a delay time that is based on the difference between a voltage of a pixel signal, which is received from a pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, and
wherein the encoder comprising:
a latch circuit that includes a plurality of latch units each of which corresponds to the plurality of delay units, each of the plurality of latch units storing delay information, the delay information being output when the pulse signal passes through each of the plurality of delay units;
an encoder unit that outputs the digital value based on the delay information; and
a counter unit that counts the number of circulations of the pulse signal passing through the plurality of delay units within a predetermined period of time, the counter unit outputting the digital value based on the number of circulations,
wherein each of the plurality of delay units and each of the plurality of latch units corresponding to each of the plurality of delay units are arranged adjacently in a first direction of the pixel array to configure each of a plurality of delay detectors,
wherein the plurality of delay detectors are arranged adjacently in the first direction, and
wherein a reference voltage wire that supplies the reference voltage to each of the plurality of A/D converters is branched to be a plurality of branched reference voltage wires, each of the plurality of branched reference voltage wires corresponds to each constituent component in the plurality of A/D converters, and each of the plurality of branched reference voltage wires is connected to a corresponding constituent component in the plurality of A/D converters.

10. The photoelectric conversion device according to claim 9, wherein a last-stage delay detector including a last-stage delay unit is arranged in the first direction so as to be arranged adjacently to the counter unit.

11. The photoelectric conversion device according to claim 9, wherein
the reference voltage wire is arranged to extend in the first direction,
a plurality of branch points are arranged in the first direction, each of the plurality of branched reference voltage wires is separated from the reference voltage wire at each of the plurality of branch points,
each of the plurality of branched reference voltage wires is arranged to extend in a second direction of the pixel array that is different from the first direction,
the plurality of A/D converters are arranged in the second direction,
a plurality of first connection points and a second connection point are arranged in the first direction, each of the plurality of delay detectors is connected to each of the plurality of branched reference voltage wires at each of the plurality of first connection points, and the counter unit is connected to each of the plurality of branched reference voltage wires at the second connection point.

12. The photoelectric conversion device according to claim 10, wherein
the first direction is a column direction of the pixel array,
a second direction is a row direction of the pixel array, and
the number of the plurality of A/D converters is based on a column number of the pixel array.

13. A photoelectric conversion device comprising:
a plurality of A/D converters each of which includes a pulse delay circuit and an encoder, the pulse delay circuit including a plurality of delay units, each of the plurality of delay units delaying a pulse signal with a delay time that is based on the difference between a voltage of a pixel signal, which is received from a pixel array, and a reference voltage, the plurality of delay units being connected so that the pulse signal can circulate through the plurality of delay units, the encoder outputting a digital value based on the number of the plurality of delay units that the pulse signal passes through within a_predetermined period of time, and
wherein the encoder comprising:
a latch circuit that includes a plurality of latch units each of which corresponds to the plurality of delay units, each of the plurality of latch units storing delay information, the delay information being output when the pulse signal passes through each of the plurality of delay units;
an encoder unit that outputs the digital value based on the delay information; and
a counter unit that counts the number of circulations of the pulse signal passing through the plurality of delay units within a predetermined period of time, the counter unit outputting the digital value based on the number of circulations,
wherein each of the plurality of delay units and each of the plurality of latch units corresponding to each of the plurality of delay units are arranged adjacently in a first direction of the pixel array to configure each of a plurality of delay detectors, wherein the plurality of delay detectors are arranged adjacently in the first direction, and wherein a reference voltage wire that supplies the reference voltage to each of the plurality of A/D converters is branched to a first branched reference voltage wire and a second branched reference voltage wire, the first branched reference voltage wire corresponds to the pulse delay circuit, the second branched reference voltage wire corresponds to a corresponding encoder, the first branched reference voltage wire is connected to the corresponding pulse delay circuit, and the second branched reference voltage wire is connected to the corresponding encoder.

14. The photoelectric conversion device according to claim 13, wherein the first branched reference voltage wire is branched to a plurality of third branched reference voltage wires each of which corresponds to a first constituent component of the pulse delay circuit, each of the plurality of third branched reference voltage wires is connected to the corresponding first constituent component, the second branched reference voltage wire is branched to a plurality of fourth branched reference voltage wires each of which corresponds to a second constituent component of the encoder, each of the plurality of fourth branched reference voltage wires is connected to the corresponding second constituent component, the first branched reference voltage wire is arranged to extend in the first direction, the second branched reference voltage wire is arranged to extend in the first direction, each of the plurality of third branched reference voltage wires is arranged to extend in a second direction of the pixel array that is different from the first direction, each of the plurality of fourth branched reference voltage wires is arranged to extend in the second direction of the pixel array that is different from the first direction, the plurality of A/D converters are arranged in the second direction, a plurality of first connection points and a second connection point are arranged in the first direction, each of the plurality of delay detectors is connected to one of the plurality of third branched reference voltage wires and the plurality of fourth branched reference voltage wires at each of the plurality of first connection points, and the counter unit is connected to each of the plurality of fourth branched reference voltage wires at the second connection point.

15. A photoelectric conversion device comprising:

a plurality of A/D converters each of which includes a pulse delay circuit and an encoder, the pulse delay circuit including a plurality of delay units, each of the plurality of delay units delaying a pulse signal with a delay time that is based on the difference between a voltage of a pixel signal, which is received from a pixel array, and a reference voltage, the plurality of delay units being connected so that the pulse signal can circulate through the plurality of delay units, the encoder outputting a digital value based on the number of the plurality of delay units that the pulse signal passes through within a predetermined period of time, and wherein the encoder comprising:

a latch circuit that includes a plurality of latch units each of which corresponds to the plurality of delay units, each of the plurality of latch units storing delay information, the delay information being output when the pulse signal passes through each of the plurality of delay units;

an encoder unit that outputs the digital value based on the delay information; and a counter unit that counts the number of circulations of the pulse signal passing through the plurality of delay units within a predetermined period of time, the counter unit outputting the digital value based on the number of circulations, wherein each of the plurality of delay units and each of the plurality of latch units corresponding to each of the plurality of delay units are arranged adjacently in a first direction of the pixel array to configure each of a plurality of delay detectors, wherein the plurality of delay detectors are arranged adjacently in the first direction, and wherein a reference voltage wire that supplies the reference voltage to each of the plurality of A/D converters is branched to a first branched reference voltage wire and a second branched reference voltage wire, the first branched reference voltage wire corresponds to the pulse delay circuit, the second branched reference voltage wire corresponds to the encoder, the first branched reference voltage wire is branched to a plurality of third branched reference voltage wires each of which corresponds to the pulse delay circuit, the second branched reference voltage wire is branched to a plurality of fourth branched reference voltage wires, each of which corresponds to a constituent component in the encoder, each of the third branched reference voltage wires is connected only to the corresponding pulse delay circuit, and each of the fourth branched reference voltage wire is connected to the corresponding constituent component.

16. The photoelectric conversion device according to claim 15, wherein the first branched reference voltage wire is arranged to extend in a second direction of the pixel array that is different from the first direction, the second branched reference voltage wire is arranged to extend in the first direction, a first branch point is arranged in the second direction, each of the plurality of third branched reference voltage wires is separated from the first branched reference voltage wire at the first branch point, a second branch point is arranged in the first direction, each of the plurality of fourth branched reference voltage wires is separated from the second branched reference voltage wire at the second branch point, the third branched reference voltage wires are arranged to extend in the first direction, the fourth branched reference voltage wires are arranged to extend in the second direction, the plurality of A/D converters are arranged in the second direction, a plurality of first connection points and a second connection point are arranged in the first direction, each of the plurality of delay detectors is connected to one of the plurality of third branched reference voltage wires and the plurality of fourth branched reference voltage wires at each of the plurality of first connection points, and the counter unit is connected to each of the plurality of fourth branched reference voltage wires at the second connection point.

17. A photoelectric conversion device comprising:
a pixel array that includes a plurality of pixels arranged two-dimensionally, each of the plurality of pixels having a photoelectric conversion element, the pixel array outputting a pixel signal in accordance with an incident light amount to the photoelectric conversion element;
a plurality of A/D converters each of which includes a pulse delay circuit and an encoder, the pulse delay circuit including a plurality of delay units, each of the plurality of delay units delaying a pulse signal with a delay time that is based on the difference between a voltage of the pixel signal, which is received from the pixel array, and a reference voltage, the plurality of delay units being connected so that the pulse signal can circulate through the plurality of delay units, the encoder outputting a digital value based on the number of the plurality of delay units that the pulse signal passes through within a predetermined period of time; and
a reference voltage wire that supplies the reference voltage to each of the plurality of A/D converters, and
wherein the encoder comprising:
  a latch circuit that includes a plurality of latch units each of which corresponds to the plurality of delay units, each of the plurality of latch units storing delay information, the delay information being output when the pulse signal passes through each of the plurality of delay units;
  an encoder unit that outputs the digital value based on the delay information; and
  a counter unit that counts the number of circulations of the pulse signal passing through the plurality of delay units within a predetermined period of time, the counter unit outputting the digital value based on the number of circulations,
wherein each of the plurality of delay units and each of the plurality of latch units corresponding to each of the plurality of delay units are arranged adjacently in a first direction of the pixel array to configure each of a plurality of delay detectors,
wherein the plurality of delay detectors are arranged adjacently in the first direction,
wherein the reference voltage wire is branched to be a plurality of branched reference voltage wires, each of the plurality of branched reference voltage wires corresponds to each constituent component in the plurality of A/D converters, and
wherein each of the plurality of branched reference voltage wires is connected to a corresponding constituent component in the plurality of A/D converters.

18. The photoelectric conversion device according to claim 17, wherein
the reference voltage wire is arranged to extend in the first direction,
a plurality of branch points are arranged in the first direction, each of the plurality of branched reference voltage wires is separated from the reference voltage wire at each of the plurality of branch points,
each of the plurality of branched reference voltage wires is arranged to extend in a second direction of the pixel array that is different from the first direction,
the plurality of A/D converters are arranged in the second direction,
a plurality of first connection points and a second connection point are arranged in the first direction, each of the plurality of delay detectors is connected to each of the plurality of branched reference voltage wires at each of the plurality of first connection points, and the counter unit is connected to each of the plurality of branched reference voltage wires at the second connection point.

* * * * *